US010531032B2

United States Patent
Cho et al.

(10) Patent No.: US 10,531,032 B2
(45) Date of Patent: Jan. 7, 2020

(54) IMAGE SENSOR CHIP THAT FEEDS BACK VOLTAGE AND TEMPERATURE INFORMATION, AND AN IMAGE PROCESSING SYSTEM HAVING THE SAME

(71) Applicant: SAMSUNG ELECTRONICS CO., LTD., Suwon-si, Gyeonggi-Do (KR)

(72) Inventors: Sang Hyun Cho, Hwaseong-si (KR); Ji Yong Park, Seoul (KR); Dae Hwa Paik, Seoul (KR); Kyoung Min Koh, Hwaseong-si (KR); Min Ho Kwon, Seoul (KR); Seung Hyun Lim, Hwaseong-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 234 days.

(21) Appl. No.: 15/591,626

(22) Filed: May 10, 2017

(65) Prior Publication Data
US 2017/0339360 A1   Nov. 23, 2017

(30) Foreign Application Priority Data

May 23, 2016   (KR) ........................ 10-2016-0062995

(51) Int. Cl.
| | | |
|---|---|---|
| *H04N 5/369* | (2011.01) |
| *H04N 5/374* | (2011.01) |
| *H03M 1/18* | (2006.01) |
| *H03M 1/12* | (2006.01) |
| *H04N 5/378* | (2011.01) |
| *H03M 7/30* | (2006.01) |
| *H03M 1/08* | (2006.01) |
| *H03M 5/02* | (2006.01) |
| *H03M 1/56* | (2006.01) |

(52) U.S. Cl.
CPC .......... *H04N 5/378* (2013.01); *H03M 1/0845* (2013.01); *H03M 1/12* (2013.01); *H03M 1/181* (2013.01); *H03M 5/02* (2013.01); *H03M 7/30* (2013.01); *H04N 5/3698* (2013.01); *H04N 5/374* (2013.01); *H03M 1/56* (2013.01)

(58) Field of Classification Search
CPC ........ H04N 5/3698; H03M 1/00; H03M 1/12; H03M 1/1205; H03M 1/182
See application file for complete search history.

(56) References Cited

U.S. PATENT DOCUMENTS 6,531,911 B1    3/2003  Hsu et al.
7,767,953 B2    8/2010  Yamaoka
(Continued)

FOREIGN PATENT DOCUMENTS

KR    1020120044493    4/2012
KR    1020140095003    7/2014

*Primary Examiner* — Ngoc Yen T Vu
(74) *Attorney, Agent, or Firm* — F. Chau & Associates, LLC

(57) ABSTRACT

An image sensor chip includes an internal voltage generator for generating internal voltages using an external voltage received at a first terminal of the image sensor chip, a temperature sensor for generating a temperature voltage, a selection circuit for outputting one of the external voltage, the internal voltages, and the temperature voltage, a digital code generation circuit for generating a digital code using an output voltage of the selection circuit, and a second terminal for outputting the digital code from the image sensor chip.

20 Claims, 23 Drawing Sheets

(56) References Cited

U.S. PATENT DOCUMENTS

| | | | |
|---|---|---|---|
| 7,787,033 B2 | 8/2010 | Rossi et al. | |
| 7,990,441 B2 | 8/2011 | Lee | |
| 8,300,142 B2* | 10/2012 | Konno | H04N 5/232 |
| | | | 348/241 |
| 8,305,474 B2 | 11/2012 | Purcell et al. | |
| 8,502,886 B2 | 8/2013 | Egawa | |
| 8,736,468 B2* | 5/2014 | Fabregas | H03M 1/12 |
| | | | 341/118 |
| 8,736,469 B2* | 5/2014 | Fabregas | H02M 7/02 |
| | | | 341/119 |
| 8,866,060 B2 | 10/2014 | Kwon et al. | |
| 9,549,135 B2* | 1/2017 | Kito | H04N 5/378 |
| 9,749,564 B2* | 8/2017 | Sone | A61B 1/04 |
| 2003/0020821 A1* | 1/2003 | Watanabe | H04N 5/23241 |
| | | | 348/312 |
| 2004/0130654 A1* | 7/2004 | Ryu | H04N 1/00899 |
| | | | 348/371 |
| 2008/0042739 A1 | 2/2008 | Lin | |
| 2010/0079649 A1* | 4/2010 | Ayraud | H04N 5/3698 |
| | | | 348/308 |
| 2011/0199519 A1 | 8/2011 | Yamauchi | |
| 2012/0242871 A1* | 9/2012 | Iwashita | H04N 5/32 |
| | | | 348/241 |
| 2014/0218599 A1* | 8/2014 | Nakamura | H04N 5/23241 |
| | | | 348/372 |
| 2016/0028981 A1 | 1/2016 | Lee et al. | |

\* cited by examiner

IMAGE SENSOR CHIP THAT FEEDS BACK VOLTAGE AND TEMPERATURE INFORMATION, AND AN IMAGE PROCESSING SYSTEM HAVING THE SAME

CROSS-REFERENCE TO RELATED APPLICATION

This application claims priority under 35 U.S.C. § 119 to Korean Patent Application No. 10-2016-0062995 filed on May 23, 2016, the disclosure of which is incorporated by reference herein in its entirety.

TECHNICAL FIELD

Exemplary embodiments of the present inventive concept relate to an image sensor chip that feeds back voltage and temperature information, and an image processing system having the same.

DISCUSSION OF RELATED ART

An image sensor is an integrated circuit having a photoelectric conversion element. A complementary metal-oxide-semiconductor (CMOS) image sensor is a solid-state imaging device using CMOS technology. The CMOS image sensor can be manufactured using a general-purpose semiconductor manufacture apparatus.

In order for the CMOS image sensor to operate, it is supplied with an operation voltage from an external main power management integrated circuit. A performance of the CMOS image sensor may be determined by the operation voltage.

SUMMARY

An exemplary embodiment of the present inventive concept provides an image sensor chip, including an internal voltage generator for generating internal voltages using an external voltage received at a first terminal of the image sensor chip, a temperature sensor for generating a temperature voltage, a selection circuit for outputting one of the external voltage, the internal voltages, and the temperature voltage, a digital code generation circuit for generating a digital code using an output voltage of the selection circuit, and a second terminal for outputting the digital code from the image sensor chip.

An exemplary embodiment of the present inventive concept provides an image processing system, including an external voltage supply device, an image sensor chip for receiving an external voltage supplied from the external voltage supply device, and an application processor connected to the image sensor chip and the external voltage supply device. The image sensor chip includes an internal voltage generator for generating internal voltages using the external voltage, a temperature sensor for generating a temperature voltage, a selection circuit for outputting one of the external voltage, the internal voltages, and the temperature voltage, a digital code generation circuit for generating a digital code using an output voltage of the selection circuit, and an output terminal for transmitting the digital code to the application processor.

An exemplary embodiment of the present inventive concept provides an image sensor chip including: a selection circuit configured to output one of a temperature voltage, an internal voltage, and an external voltage; an attenuator configured to attenuate a first output signal of the selection circuit to generate a second output signal; and an analog-to-digital converter configured to generate a feedback signal using the second output signal.

BRIEF DESCRIPTION OF THE DRAWINGS

The above and/or other features of the present inventive concept will become apparent by describing in detail exemplary embodiments thereof, with reference to the accompanying drawings in which.

DETAILED DESCRIPTION OF THE EMBODIMENTS

Figure 1:
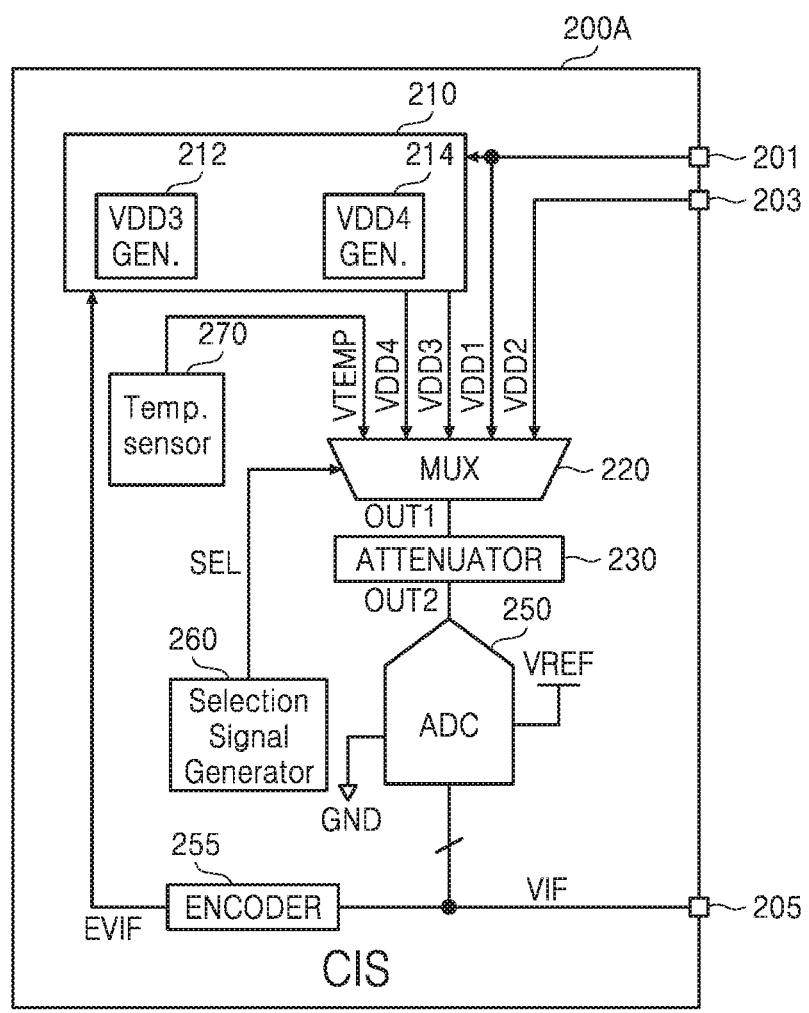
FIG. 1 is a block diagram of an image sensor chip according to an exemplary embodiment of the present inventive concept.

Exemplary embodiments of the present inventive concept will now be described in detail with reference to the accompanying drawings. In the drawings, like reference numerals refer to like elements.

An analog-to-digital converter (ADC) for converting information of a voltage (or an analog voltage signal) into a digital voltage signal (250 of FIG. 1, 250A of FIGS. 4, and 250B of FIG. 12) is referred to herein as a voltage information ADC.

FIG. 1 is a block diagram of an image sensor chip according to an exemplary embodiment of the present inventive concept. Referring to FIG. 1, an image sensor chip (or image sensor) 200A may include a plurality of pins (or pads) 201, 203, and 205, an internal voltage generator 210, a selection circuit 220, an attenuator 230, a voltage information ADC 250, an encoder 255, a selection signal generator 260, and a temperature sensor 270. For example, the components introduced above 210, 220, 230, 250, 255, 260, and 270 may form (or compose) a voltage and temperature monitoring circuit embodied (or integrated) in a portion of the image sensor chip 200A.

The image sensor chip 200A may refer to a complementary metal-oxide-semiconductor (CMOS) image sensor chip (CIS) manufactured by a CMOS process, and may be included (installed) in a mobile device. The mobile device may be embodied in a mobile phone, a smart phone, a tablet personal computer (PC), a mobile internet device (MID), an internet of things (IoT) device, an internet of everything (IoE) device, a wearable computer, or a drone. For example, the image sensor chip 200A may be included in an image sensor module, and the image sensor module may be included in the mobile device.

Figure 22:
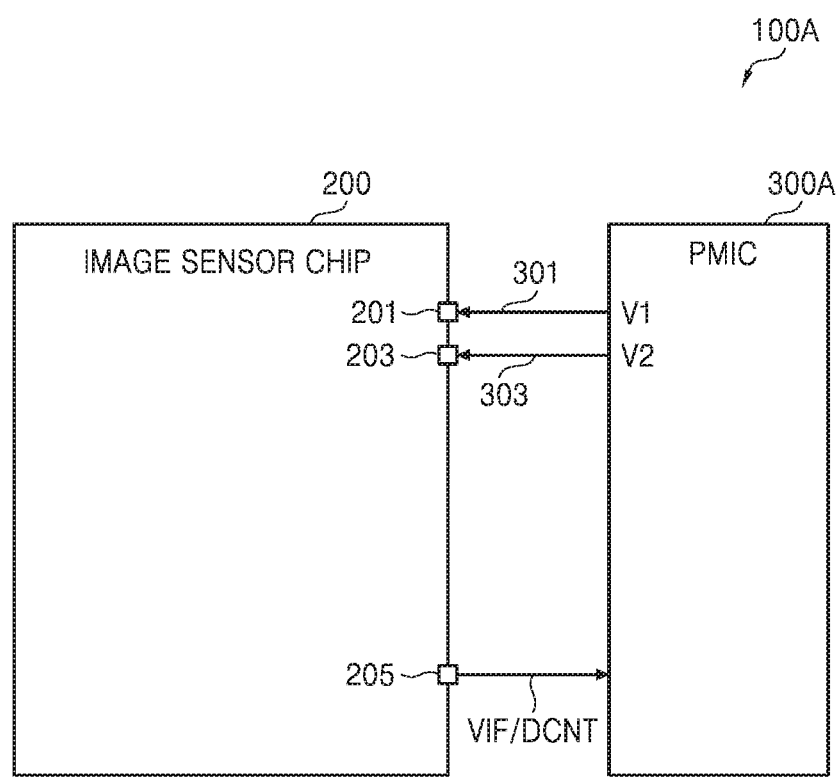
FIG. 22 is a block diagram of an image processing system including the image sensor chip shown in FIG. 1, 4, or 12 according to an exemplary embodiment of the present inventive concept.
Figure 23:
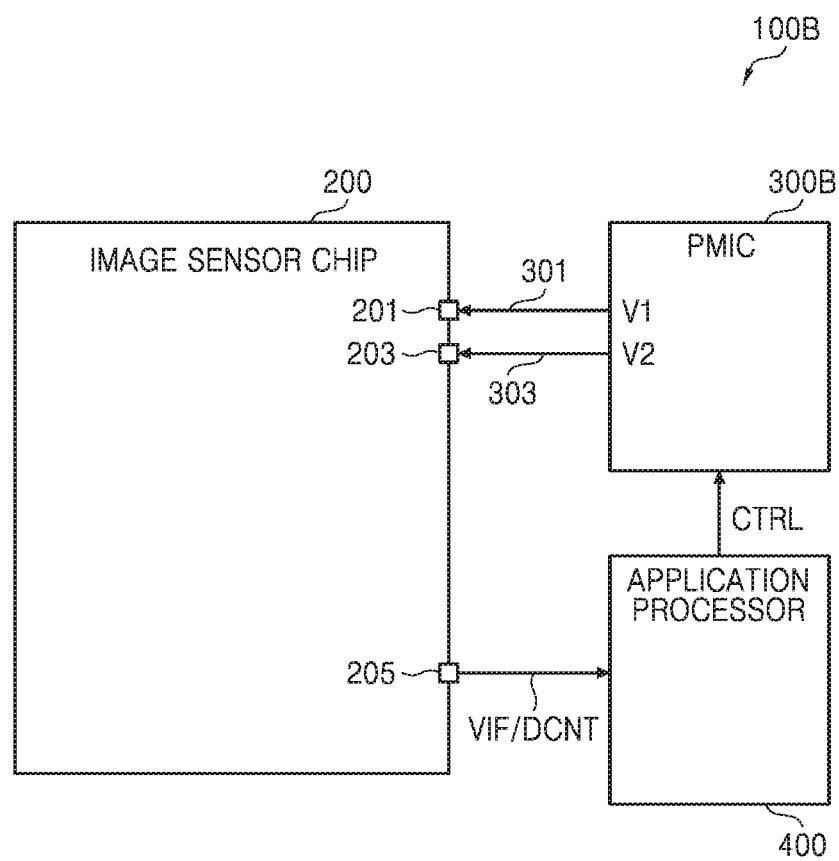
FIG. 23 is a block diagram of an image processing system including the image sensor chip shown in FIG. 1, 4, or 12 according to an exemplary embodiment of the present inventive concepts.

A first pin 201 may receive a first external voltage VDD1 supplied from an external voltage supply device (for example, 300A of FIG. 22 or 300B of FIG. 23). A second pin 203 may receive a second external voltage VDD2 supplied from the external voltage supply device. Although it is shown that the image sensor chip 200A receives the first external voltage VDD1 and the second external voltage VDD2 in FIG. 1, it is to be understood that the image sensor chip 200A may receive various external voltages from the external voltage supply device. Further, the external voltage supply device may be included in the image sensor module, for example.

A third pin 205 may transmit feedback information VIF to the external voltage supply device 300A shown in FIG. 22 or an application processor 400 shown in FIG. 23. For example, the third pin 205 may refer to at least one of pins for transmitting image data generated in the image sensor chip 200A or a dedicated pin.

For example, the feedback information VIF may refer to digital signals or a digital code which shows information on an external voltage VDD1 or VDD2 supplied from the external voltage supply device, information on an internal voltage VDD3 or VDD4 generated by the internal voltage generator 210, and/or information VTEMP on a temperature of the image sensor chip 200A when the image sensor chip 200A operates.

The internal voltage generator 210 may generate various internal voltages VDD3 and VDD4 using the first external voltage VDD1. For example, the internal voltage generator 210 may be an internal power management IC. The internal voltage generator 210 may include a first internal voltage generator 212 for generating a first internal voltage VDD3 and a second internal voltage generator 214 for generating a second internal voltage VDD4. A structure and an operation of each of the internal voltage generators 212 and 214 will be described in detail referring to FIGS. 8 to 11.

For example, the first external voltage VDD1 may be used as an operation voltage of an analog circuit embodied in the image sensor chip 200A, the second external voltage VDD2 may be used as an operation voltage of a digital circuit embodied in the image sensor chip 200A, the first internal voltage VDD3 may be used to turn on a transmission transistor of each active pixel sensor included in an active pixel sensor array of the image sensor chip 200A, and the second internal voltage VDD4 may be used to turn off the transmission transistors. For example, the first internal voltage VDD3 may be higher than the first external voltage VDD1, and the second internal voltage VDD4 may be a negative voltage lower than a ground voltage GND; however, it is not limited thereto.

The selection circuit 220 may output at least one of a plurality of voltages VDD1, VDD2, VDD3, VDD4, and VTEMP as a first output voltage OUT1 in response to a selection signal SEL. The selection signal SEL may refer to a plurality of signals. For example, the selection circuit 220 may be embodied in a multiplexer. According to an exemplary embodiment of the present inventive concept, the selection circuit 220 may output the ground voltage GND as the first output voltage OUT1 in response to the selection signal SEL.

The voltage information ADC 250 may convert an analog input signal OUT2 into a digital output signal VIF, and may express a relative magnitude of the analog input signal OUT2 with respect to a reference voltage VREF as the digital output signal VIF. The analog input signal OUT2 should be smaller than the reference voltage VREF in magnitude (or voltage level) so that the voltage information ADC 250 performs a normal function.

When each of the voltages VDD1, VDD2, and VDD3 is larger than the reference voltage VREF in magnitude, the attenuator 230 is used.

Figure 2:
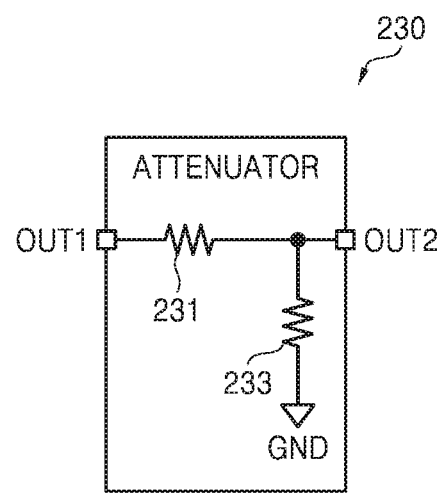
FIG. 2 is a circuit diagram of an attenuator shown in FIG. 1 according to an exemplary embodiment of the present inventive concept.

FIG. 2 is a circuit diagram of an attenuator shown in FIG. 1 according to an exemplary embodiment of the present inventive concept. The attenuator 230 shown in FIG. 2 includes resistors 231 and 233. An attenuation constant (a) may be calculated as shown in Equation 1.

$$a = \frac{R_{233}}{R_{231} + R_{233}} \quad \text{[Equation 1]}$$

Here, $R_{231}$ is a resistance value of a first resistor 231 and $R_{233}$ is a resistance value of a second resistor 233. For example, a second output voltage OUT2 of the attenuator 230 is a*OUT1 and is smaller than the reference voltage VREF.

The voltage information ADC 250 may use the reference voltage VREF and the ground voltage GND as operation voltages, and convert a second output voltage OUT2=a*OUT1 of the attenuator 230 into a digital output signal VIF.

The encoder 255 may convert a c-bit digital output signal VIF into a d-bit control signal EVIF. Here, c and d are natural numbers and c is greater than d. For example, when c is 10, d may be 4; however, it is not limited thereto. Each of the internal voltage generators 212 and 214 may adjust a level of each internal voltage VDD3, VDD3', VDD4, Vx1, Vx2, Vx3, and/or Vy to be described hereinafter in response to a d-bit control signal EVIF.

The selection signal generator 260 may generate a selection signal SEL. As described above, the selection circuit 220 may output at least one of the plurality of voltages VDD1, VDD2, VDD3, VDD4, and VTEMP as the first output voltage OUT1 in response to the selection signal SEL.

The temperature sensor 270 may sense a temperature (for example, an internal temperature) of the image sensor chip 200A and generate a voltage VTEMP having temperature information according to a result of the sensing. VTEMP may hereinafter be referred to as 'temperature voltage'. Although one temperature sensor 270 is shown in FIG. 1, the temperature sensor 270 may collectively represent a plurality of temperature sensors disposed at various positions inside or outside the image sensor chip 200A.

The image sensor chip 200A may feedback information VIF on an external voltage VDD1 and/or VDD2 supplied from an external voltage supply device (for example, 300A of FIG. 22 or 300B of FIG. 23), information VIF on an internal voltage VDD3 and/or VDD4 generated by the internal voltage generator 210 using the first external voltage VDD1, and/or information VIF on a temperature of the image sensor chip 200A to the external voltage supply device (for example, 300A of FIG. 22 or 300B of FIG. 23) and/or the internal voltage generator 210.

The external voltage supply device (for example, 300A of FIG. 22 or 300B of FIG. 23) can adjust a level of the external voltage VDD1 and/or VDD2 supplied to the image sensor chip 200A using the feedback information VIF, and the internal voltage generator 210 can adjust the internal voltages VDD3 and/or VDD4 using a control signal EVIF corresponding to the feedback information VIF. For example, the encoder 255 and the selection signal generation circuit 260 may be disposed in a timing controller for controlling an operation of the image sensor chip 200A.

A digital code generation circuit may collectively refer to a circuit for generating a digital code VIF using an output voltage OUT1 of the selection circuit 220. Accordingly, the digital code generation circuit may include the attenuator 230 and the voltage information ADC 250.

Figure 3:
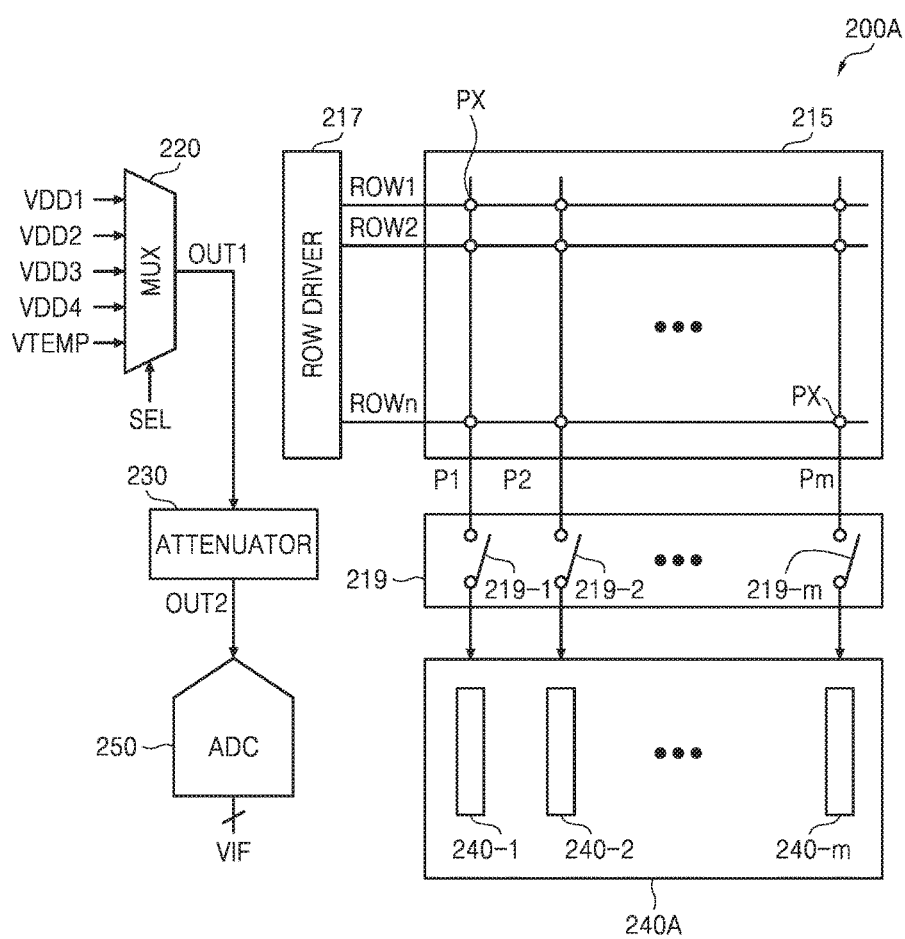
FIG. 3 is a block diagram of the image sensor chip shown in FIG. 1 according to an exemplary embodiment of the present inventive concept.

FIG. 3 is a block diagram of the image sensor chip shown in FIG. 1 according to an exemplary embodiment of the present inventive concept. Referring to FIG. 3, the image sensor chip 200A may include an active pixel sensor array 215, a row driver 217, a correlated double sampling (CDS) circuit block 219, the selection circuit 220, the attenuator 230, a column ADC block 240A, and the voltage information ADC 250.

In the image sensor chip 200A, components not shown in FIG. 1 may be complemented or supplemented with the components 215, 217, 219, and 240A shown in FIG. 3, and components not shown in FIG. 3 may be complemented or supplemented with the components 201, 203, 205, 210, 255, 260, and 270 shown in FIG. 1.

The active pixel sensor array 215 may include a plurality of active pixel sensors PX. Each of the active pixel sensors PX may include one photoelectric conversion element PD and four transistors; however, the number of transistors may be three or five (or more) depending on a structure of an active pixel sensor.

The row driver 217 may generate each of row control signals ROW1 to ROWn, where n is a natural number of three or more, for controlling active pixel sensors PX disposed in each row. According to a control of the row driver 217, each of pixel signals P1 to Pm output from each active pixel sensor PX disposed in each column may be output to each column line.

The CDS circuit block 219 may include CDS circuits 219-1 to 219-m. The CDS circuits 219-1 to 219-m may perform CDS on the pixel signals P1 to Pm transmitted through the column lines and generate correlated double sampled pixel signals.

The column ADC block 240A may include ADCs 240-1 to 240-m. The ADCs 240-1 to 240-m may convert the correlated double sampled pixel signals into digital signals. Each of the ADCs 240-1 to 240-m may be embodied in a single slope ADC; however, it is not limited thereto. The ADCs 240-1 to 240-m are the same as or similar to each other in structure and operation. Each of the ADCs 240-1 to 240-m may be a comparator.

The voltage information ADC 250 may be separately embodied (or integrated) in the image sensor chip 200A. The voltage information ADC 250 may be different from each of the ADCs 240-1 to 240-m in structure and operation.

Figure 4:
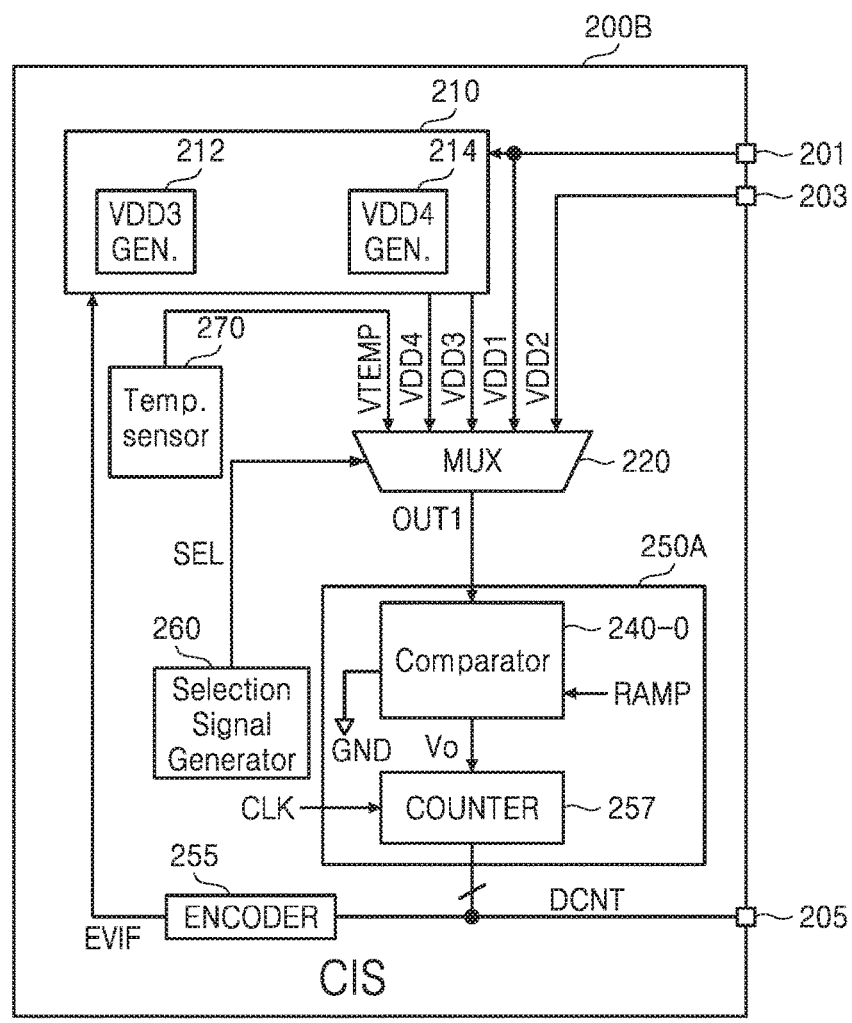
FIG. 4 is a block diagram of an image sensor chip according to an exemplary embodiment of the present inventive concept.

FIG. 4 is a block diagram of an image sensor chip according to an exemplary embodiment of the present inventive concept. An image sensor chip 200B of FIG. 4 does not use the ADC 250 like the image sensor chip 200A of FIG. 1, but rather uses a surplus or dummy ADC 240-0 embodied in a column ADC block 240B of FIG. 5. The surplus or dummy ADC 240-0 may be a comparator. Therefore, a voltage information ADC 250A may include the comparator 240-0 and a counter 257.

The image sensor chip 200B may include a plurality of pins 201, 203, and 205, the internal voltage generator 210, the selection circuit 220, the voltage information ADC 250A, the encoder 255, the selection signal generator 260, and the temperature sensor 270. The image sensor chip 200B may be manufactured by a CMOS process and may be included in a mobile device.

Each of the pins 201 and 203 may receive each of the external voltages VDD1 and VDD2 supplied by the external voltage supply device (for example, 300A of FIG. 22 or 300B of FIG. 23). A third pin 205 may be used as an output pin for transmitting feedback information DCNT to the external voltage supply device 300A shown in FIG. 22 or the application processor 400 shown in FIG. 23. The feedback information VIF of FIG. 1 and the feedback information DCNT of FIG. 4 may include the same information.

For example, the feedback information DCNT may be digital signals or a digital code which includes information on the external voltage VDD1 and/or VDD2 supplied by the external voltage supply device 300A or 300B, information on the internal voltage VDD3 and/or VDD4 generated by the internal voltage generator 210, and/or information VTEMP on the temperature of the image sensor chip 200B.

The selection circuit 220 may output at least one of the plurality of voltages VDD1, VDD2, VDD3, VDD4, and VTEMP as the first output voltage OUT1 in response to the selection signal SEL.

Figure 6:
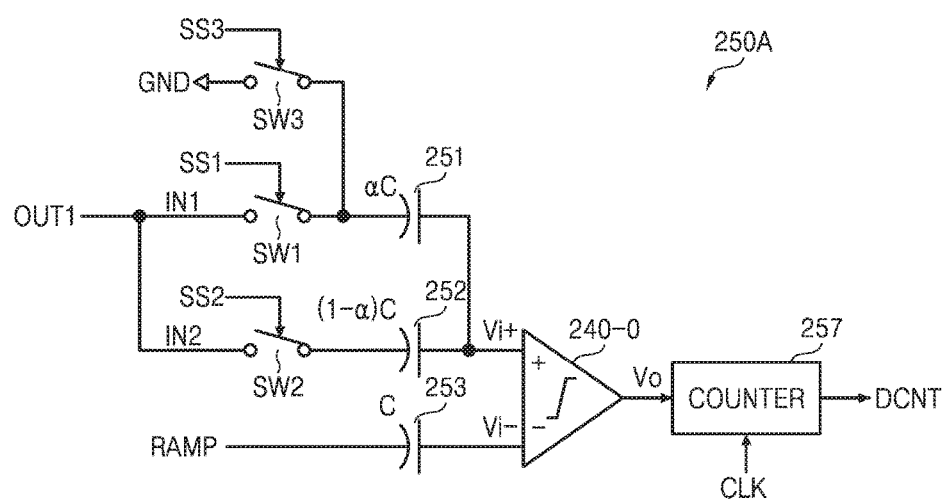
FIG. 6 is a circuit diagram of a voltage information analog-to-digital converter shown in FIGS. 4 and 5 according to an exemplary embodiment of the present inventive concept.

When an input stage of the voltage information ADC 250A includes capacitors 251, 252, and 253 for sampling an analog input signal OUT1 as shown in FIG. 6, the input stage of the voltage information ADC 250A may attenuate the analog input signal OUT1 at a given rate without using the attenuator 230 shown in FIG. 2. As shown in FIG. 6, an input signal OUT1=IN1 requiring an analog-to-digital conversion is attenuated by an attenuation constant (a) by the capacitor 251.

The voltage information ADC 250A may convert the first output voltage OUT1 of the selection circuit 220 into a digital signal, e.g., the feedback information DCNT.

The comparator 240-0 may compare a ramp signal RAMP with the first output voltage OUT1 and generate a comparison signal Vo. The counter 257 may generate the feedback information DCNT using the comparison signal Vo and a clock signal CLK. An operation of the voltage information ADC 250A will be described in detail referring to FIGS. 5 to 7. A digital code generation circuit may include the voltage information ADC 250A.

The encoder 255 may convert a c-bit digital output signal DCNT into a d-bit control signal EVIF. Each of the internal voltage generators 212 and 214 may adjust a level of each of the internal voltages VDD3 and VDD4 in response to the d-bit control signal EVIF.

The image sensor chip 200B may feedback information DCNT on the external voltage VDD1 and/or VDD2 supplied from the external voltage supply device 300A or 300B, information DCNT on the internal voltage VDD3 and/or VDD4 generated by the internal voltage generator 210 using the first external voltage VDD1, and/or information DCNT on a temperature of the image sensor chip 200B to the external voltage supply device 300A or 300B and/or the internal voltage generator 210.

Accordingly, the external voltage supply device (for example, 300A of FIG. 22 or 300B of FIG. 23) can adjust a level of the external voltage VDD1 and/or VDD2 supplied to the image sensor chip 200B in response to (or using) the feedback information DCNT, and the internal voltage generator 210 can adjust a level of the internal voltage VDD3 and/or VDD4 in response to (or using) the control signal EVIF.

Figure 5:
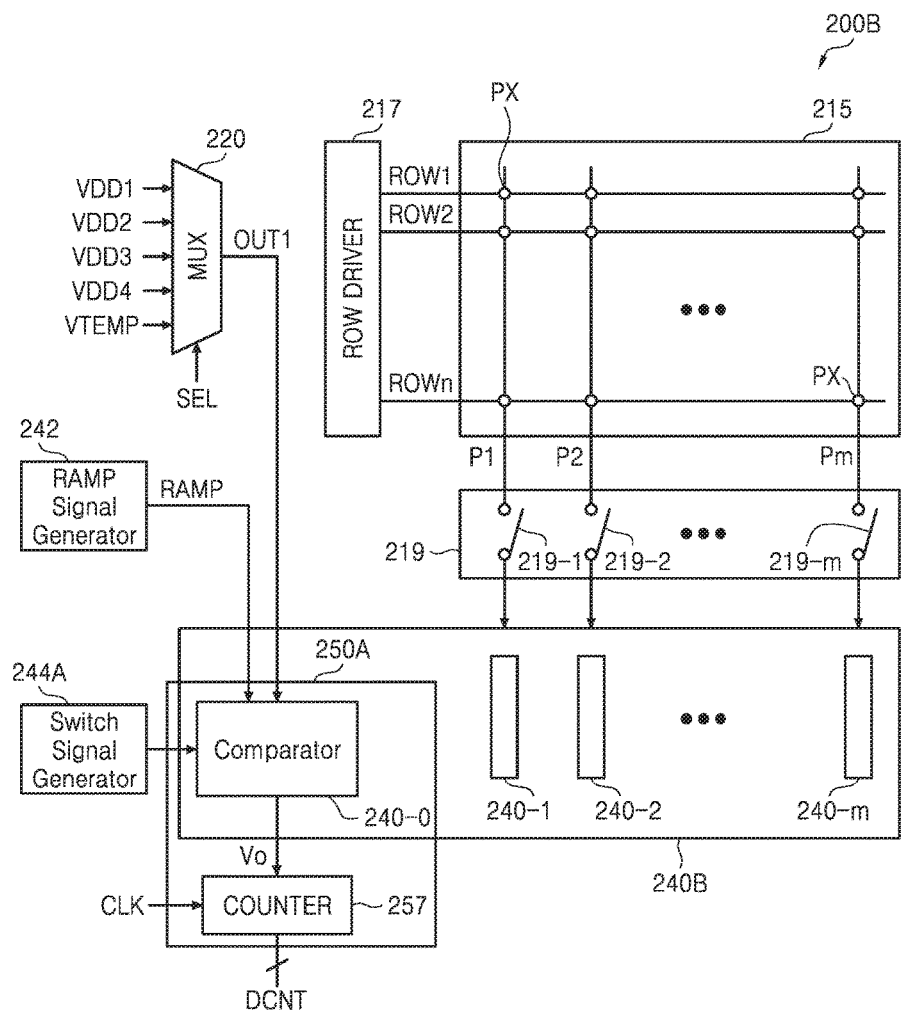
FIG. 5 is a block diagram of the image sensor chip shown in FIG. 4 according to an exemplary embodiment of the present inventive concept.

FIG. 5 is a block diagram of the image sensor chip shown in FIG. 4 according to an exemplary embodiment of the present inventive concept. Referring to FIGS. 4 and 5, the image sensor chip 200B may include the active pixel sensor array 215, the row driver 217, the CDS circuit block 219, the selection circuit 220, the column ADC block 240B, a ramp signal generator 242, a switch signal generator 244A, and the counter 257. As described above, the voltage information ADC 250A may include a dummy ADC 240-0 included in the column ADC block 240B and the counter 257. The dummy ADC 240-0 may not perform an analog-to-digital conversion operation on the pixel signals P1 to Pm output from the active pixel sensor array 215.

In the image sensor chip 200B, components not shown in FIG. 4 may be complemented or supplemented with the components 215, 217, 219, 240B, 242, and 244A shown in FIG. 5, and components not shown in FIG. 5 may be complemented or supplemented with the components 201, 203, 205, 210, 255, 260, and 270 shown in FIG. 4.

The column ADC block 240B may include ADCs 240-1 to 240-m and the dummy ADC 240-0. The ADCs 240-1 to 240-m may convert correlated double sampled pixel signals into digital signals. Each of the ADCs 240-0 to 240-m may be embodied in a single slope ADC. The ADCs 240-0 to 240-m may be the same as each other in structure and operation.

The ramp signal generator 242 may generate a ramp signal RAMP and the ramp signal RAMP may be supplied to each of the ADCs 240-0 to 240-m. The switch signal generator 244A may control activation timing and deactivation timing of each of switch signals SS1, SS2, and SS3 shown in FIG. 6.

Switches SW1, SW2, and SW3 of FIG. 6 may be turned on in response to a respective one of activated switch signals SS1, SS2, and SS3, and may be turned off in response to a respective one of deactivated switch signals SS1, SS2, and SS3. FIG. 6 is a circuit diagram of a voltage information ADC shown in FIGS. 4 and 5 according to an exemplary embodiment of the present inventive concept. Referring to FIGS. 4 to 6, the voltage information ADC 250A may include the plurality of switches SW1, SW2, and SW3, the capacitors 251, 252, and 253, the comparator 240-0, and the counter 257.

It is assumed that a first capacitor 251 has capacitance of $\alpha C$, a second capacitor 252 has capacitance of $(1-a)C$, a third capacitor 255 has capacitance of C, and an attenuation constant $\alpha$ is greater than 0 and less than 1.

Figure 7:
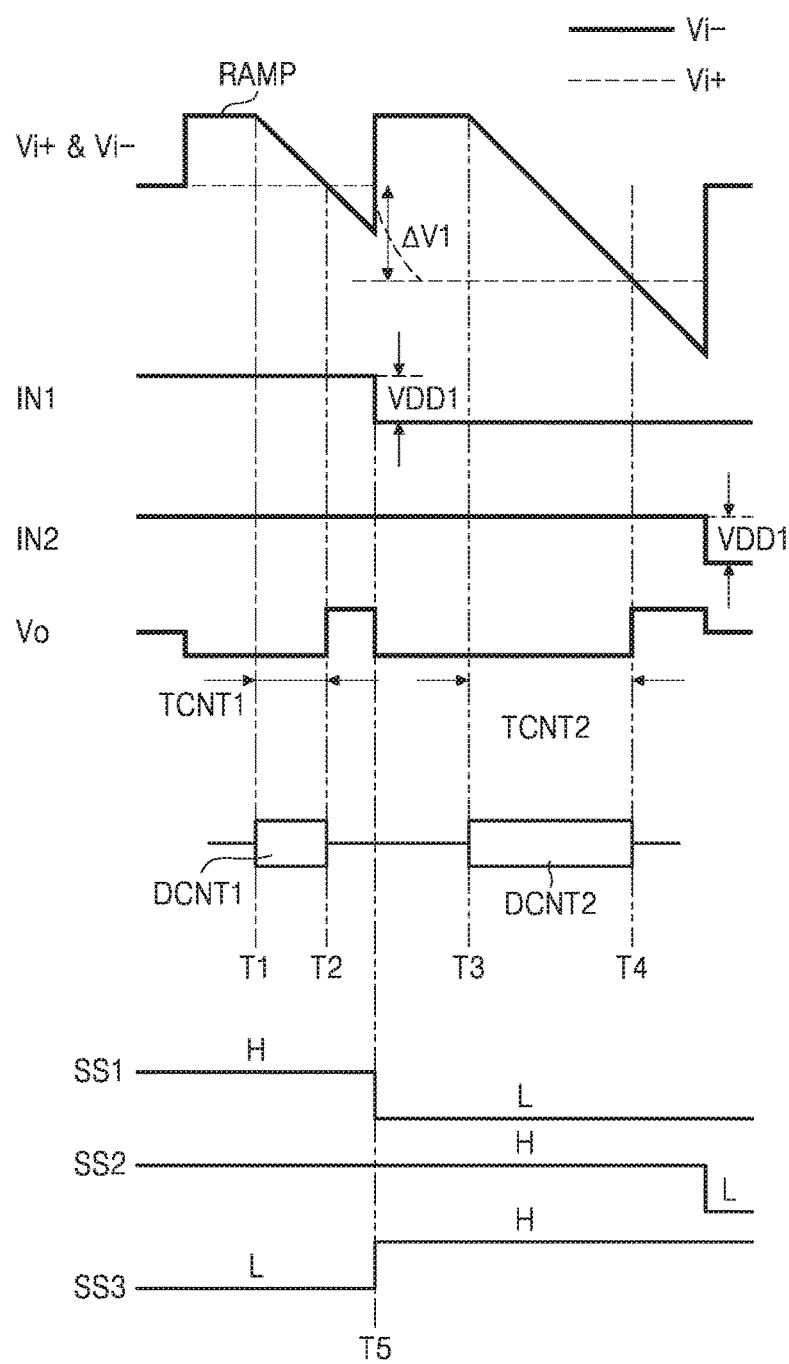
FIG. 7 is a timing diagram for describing an operation of the voltage information analog-to-digital converter shown in FIG. 6 according to an exemplary embodiment of the present inventive concept.

FIG. 7 is a timing diagram for describing an operation of the voltage information ADC shown in FIG. 6 according to an exemplary embodiment of the present inventive concept. A process of calculating a count value of the first external voltage VDD1 among the voltages VDD1, VDD2, VDD3, VDD4, and VTEMP will be described in detail referring to FIGS. 4 to 7. For example, FIG. 7 is a timing diagram of the voltage information ADC 250A for performing an analog-to-digital conversion on the first external voltage VDD1.

The analog-to-digital conversion is performed two times on the first external voltage VDD1. To perform the first conversion, each of the switch signals SS1 and SS2 is activated to a high level and a third switch signal SS3 is deactivated to a low level.

For the first conversion, the first output voltage OUT1 is simultaneously supplied to the first capacitor 251 and the second capacitor 252. A voltage (IN1=OUT1) supplied to the first switch SW1 is the same as a voltage IN2=OUT1 supplied to the second switch SW2. The ramp signal RAMP is supplied to a second input terminal − of the comparator 240-0 through a third capacitor 253. A voltage Vi− of the second input terminal − is the same as the ramp signal RAMP.

For the first conversion, a time interval from time T1 at which the ramp signal RAMP linearly falls (or ramps-down) to a time T2 at which an output signal $V_o$ of the comparator 240-0 transits from a low level to a high level is referred to as a first time interval TCNT1. When a voltage Vi+ of a first input terminal + of the comparator 240-0 is the same as the voltage Vi− of the second input terminal − of the comparator 240-0, the comparator 240-0 generates an output signal Vo, e.g., a comparison signal, transiting from a low level to a high level.

The counter 257 counts the first time interval TCNT1 in response to the clock signal CLK and generates a first count value, e.g., a first digital code DCNT1. In other words, the counter 257 starts a count operation using the clock signal CLK at the time T1 at which the ramp signal RAMP linearly falls, and stops the count operation at the time T2 at which the output signal Vo of the comparator 240-0 transits from a low level to a high level. The counter 257 may store the first digital code DCNT1 at a time when the count operation is stopped.

At time T5, a first switch signal SS1 is deactivated to a low level, a second switch signal SS2 keeps a high level, and a third switch signal SS3 is activated to a high level to perform the second conversion. As a first terminal of the first capacitor 251 is connected to a ground, the voltage Vi+ of the first input terminal + of the comparator 240-0 is changed. A change amount ΔV of the voltage Vi+ of the first input terminal + may be αVDD1.

For the second conversion, a time interval from time T3 at which the ramp signal RAMP linearly falls to a time T4 at which the output signal Vo of the comparator 240-0 transits from a low level to a high level is referred to as a second time interval TCNT2. When the voltage Vi+ of the first input terminal + of the comparator 240-0 is the same as the voltage Vi− of the second input terminal − of the comparator 240-0, the comparator 240-0 generates the output signal Vo transiting from a low level to a high level.

The counter 257 counts the second time interval TCNT2 in response to the clock signal CLK and generates a second count value, e.g., a second digital code DCNT2. In other words, the counter 257 starts a count operation using the clock signal CLK at the time T3 at which the ramp signal RAMP linearly falls, and stops the count operation at the time T4 at which the output signal Vo of the comparator 240-0 transits from a low level to a high level. The counter 257 may store the second digital code DCNT2 at a time when the count operation is stopped.

The counter 257 may calculate a difference between the second digital code DCNT2 and the first digital code DCNT1, and generate and store a digital code DCNT=DCNT2−DCNT1 which can be used as feedback information according to a result of the calculation.

According to an exemplary embodiment of the present inventive concept, the counter 257 may calculate a difference between the second digital code DCNT2 and the first digital code DCNT1 using a bit reversal technique, and generate and store the digital code DCNT. For example, the counter 257 may generate the digital code DCNT by reversing each of all bits included in the first digital code DCNT1 and adding the reversed first digital code and the second digital code DCNT2. The counter 257 may include a count function, a difference calculation function, and a storage function.

The digital code DCNT=DCNT2−DCNT1 may be transmitted to the power management IC 300A of FIG. 22 or the application processor 400 of FIG. 23 through the third pin 205. The power management IC 300A of FIG. 22 or the application processor 400 of FIG. 23 may measure or calculate the first external voltage VDD1 using Equation 2.

$$DCNT_{max}:VREF = DCNT:a \times VDD1 \quad \text{[Equation 2]}$$
$$VDD1 = \frac{1}{a}\left(\frac{DCNT}{DCNT_{max}}\right) \times VREF$$

Here, $DCNT_{max}$ is a number determined according to a resolution of the ADC 250A, and, for example, when the voltage information ADC 250A is a 10-bit ADC, the $DCNT_{max}$ may be $2^{10}=1024$.

The power management IC 300A of FIG. 22 or the application processor 400 of FIG. 23 knows values of $DCNT_{max}$, VREF, and a, and thus, may calculate or measure the first external voltage VDD1 using the digital code DCNT.

Even if the power management IC 300A of FIG. 22 or the power management IC 300B of FIG. 23 supplies a supply voltage V1 to the image sensor chip 200B, the first external voltage VDD1 becomes lower than the supply voltage V1 due to a voltage drop by a transmission line 301 (see FIGS. 22 and/or 23) present between the power management IC 300A or 300B and the image sensor chip 200B. Accordingly, the power management IC 300A of FIG. 22 or the application processor 400 of FIG. 23 may increase or decrease the supply voltage V1 using the calculated or measured first external voltage VDD1.

For example, the first external voltage VDD1 to be used in the image sensor chip 200B may be 2.8V in consideration of the voltage drop caused by the transmission line 301; however, when the calculated first external voltage VDD1 corresponding to the digital code DCNT is lower than 2.8V, the power management IC 300A or 300B may increase the supply voltage V1 until the calculated first external voltage VDD1 corresponding to the digital code DCNT becomes 2.8V.

However, when the first external voltage VDD1 to be used in the image sensor chip 200B is 2.8V, and the calculated first external voltage VDD1 corresponding to the digital code DCNT is higher than 2.8V, the power management IC 300A or 300B may decrease the supply voltage V1 until the calculated first external voltage VDD1 corresponding to the digital code DCNT becomes 2.8V.

Although FIG. 7 shows a timing diagram for calculating the digital code DCNT corresponding to the first external voltage VDD1, the voltage information ADC circuit 250A shown in FIG. 6 may generate a digital code DCNT for each of the voltages VDD2, VDD3, VDD4, and VTEMP using the timing diagram shown in FIG. 7.

The digital code DCNT for each of the voltages VDD2, VDD3, VDD4, and VTEMP may be transmitted to the power management IC 300A of FIG. 22 or the application processor 400 of FIG. 23 through the third pin 205. The power management IC 300A of FIG. 22 or the application processor 400 of FIG. 23 may measure or calculate each of the voltages VDD2, VDD3, VDD4, and VTEMP using Equation 2.

Each of the internal voltage generators 212 and 214 may adjust a level of each voltage VDD3 or VDD4 using the control signal EVIF output from the encoder 255 and corresponding to each of the voltages VDD3, VDD4, and VTEMP.

The image sensor chip 200A, 200B, or 200C (see FIG. 12) is configured to make a third internal voltage VDD3 higher than a highest voltage, e.g., the first external voltage VDD1, for a more effective operation of the active pixel sensors PX.

Figure 9:
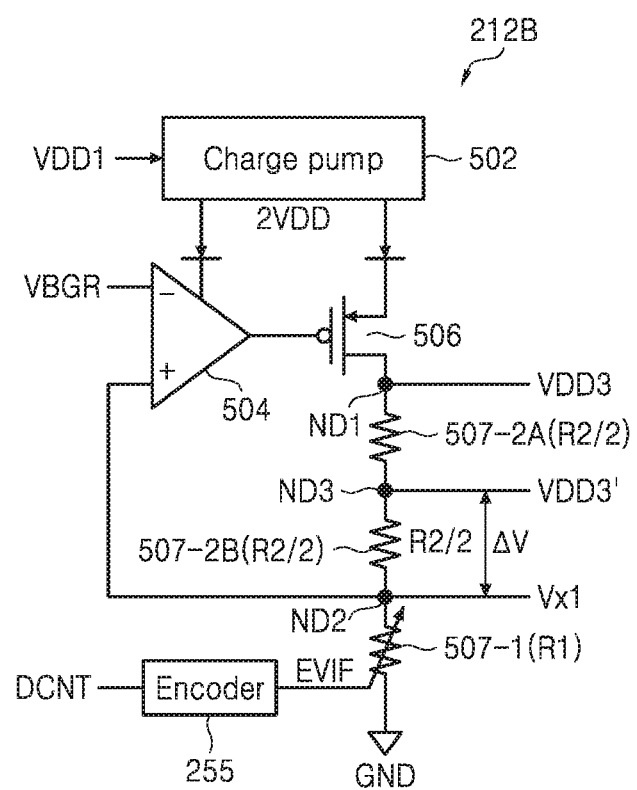
FIG. 9 is a circuit diagram of the first internal voltage generator shown in FIGS. 1, 4, and 12 according to an exemplary embodiment of the present inventive concept.
Figure 10:
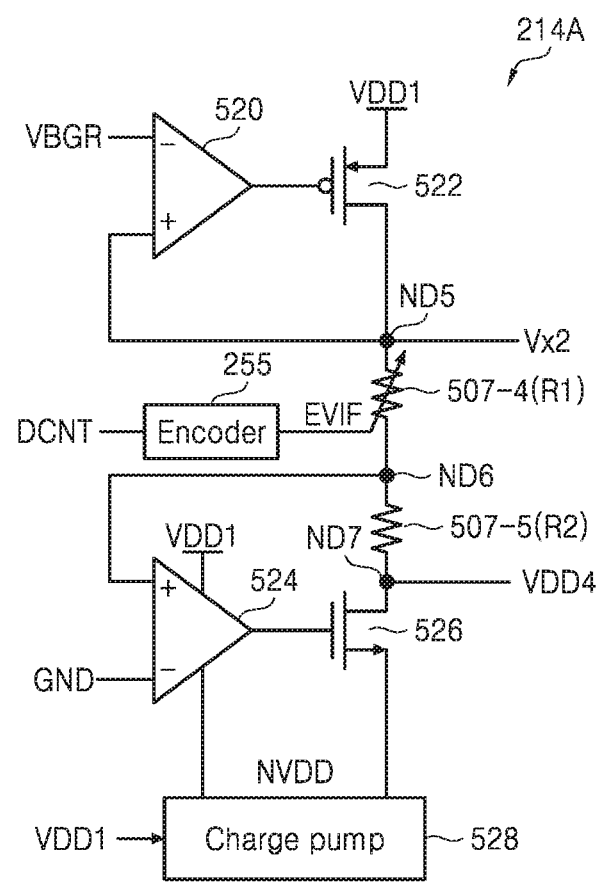
FIG. 10 is a circuit diagram of a second internal voltage generator shown in FIGS. 1, 4, and 12 according to an exemplary embodiment of the present inventive concept.
Figure 11:
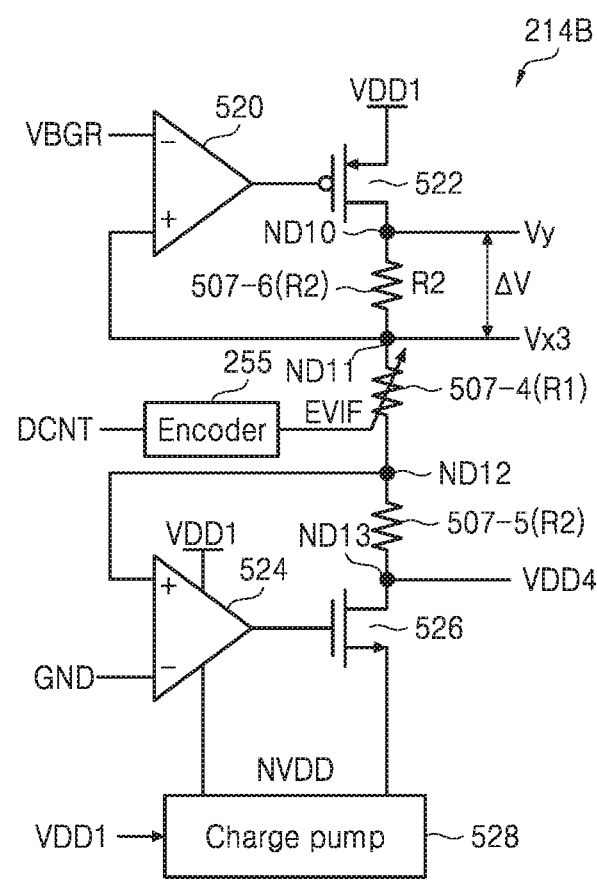
FIG. 11 is a circuit diagram of the second internal voltage generator shown in FIGS. 1, 4, and 12 according to an exemplary embodiment of the present inventive concept.

In addition, the image sensor chip 200A, 200B, or 200C is configured to make a voltage, e.g., the second internal voltage VDD4, lower than the ground voltage GND, and thus, may include the first internal voltage generator 212 and the second internal voltage generator 214. Various exemplary embodiments 212A and 212B of the first internal voltage generator 212 are shown in FIGS. 8 and 9, and various exemplary embodiments 214A and 214B of the second internal voltage generator 214 are shown in FIGS. 10 and 11.

Figure 8:
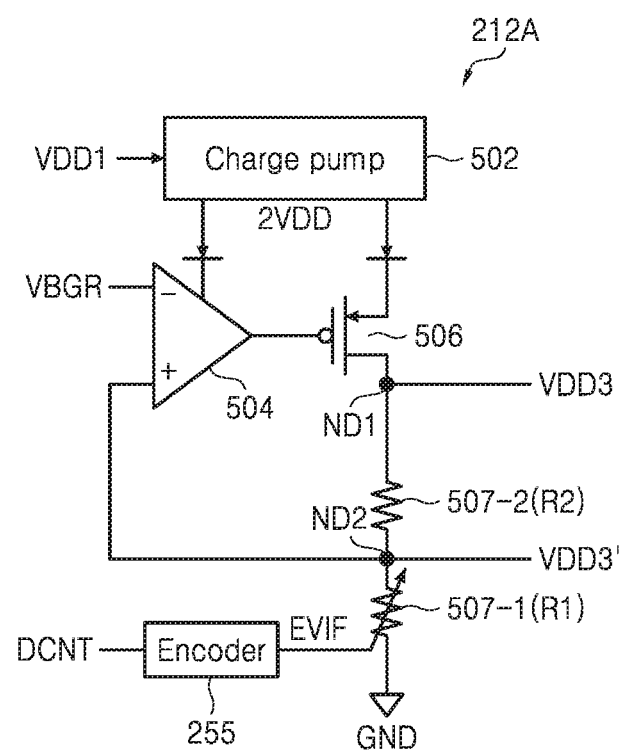
FIG. 8 is a circuit diagram of a first internal voltage generator shown in FIGS. 1, 4, and 12 according to an exemplary embodiment of the present inventive concept.
Figure 12:
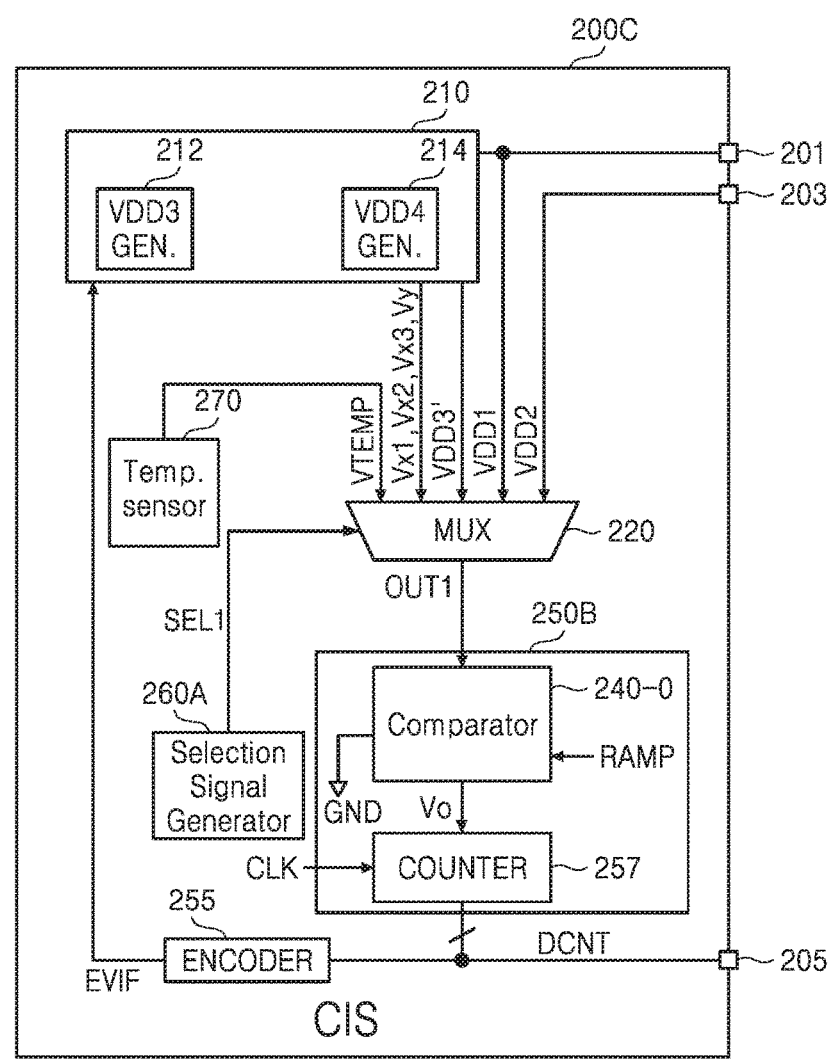
FIG. 12 is a block diagram of an image sensor chip according to an exemplary embodiment of the present inventive concept.

FIG. 8 is a circuit diagram of a first internal voltage generator shown in FIGS. 1, 4, and 12 according to an exemplary embodiment of the present inventive concept. The first internal voltage generator 212A may include a charge pump 502, an amplifier 504, a switch circuit 506, and two resistors 507-1 and 507-2.

A voltage regulator may include the amplifier 504, the switch circuit 506, and the two resistors 507-1 and 507-2. The voltage regulator may generate the first internal voltage VDD3 higher than the first external voltage VDD1.

The charge pump 502 may generate a first voltage pump voltage 2VDD corresponding to nearly twice the first external voltage VDD1 by amplifying the first external voltage VDD1.

The amplifier 504 may perform a function of an error amplifier using the first voltage pump voltage 2VDD and the ground voltage as operation voltages, amplify a difference between a reference voltage VBGR and a voltage (e.g., feedback voltage) of a second node ND2, and generate an amplified voltage. The reference voltage VBGR may be an output voltage of a bandgap voltage reference circuit.

The switch circuit 506 may perform a function of a power transistor and pull-up a voltage VDD3 of a first node ND1, in other words, the first internal voltage VDD3, to the first voltage pump voltage 2VDD in response to a voltage amplified by the amplifier 504.

The resistors 507-1 and 507-2 may form a negative feedback network. The resistors 507-1 and 507-2 may perform a function of a voltage divider, and generate a first intermediate voltage VDD3' by dividing the first internal voltage VDD3. A resistance value R2 of a second resistor 507-2 may be larger than a resistance value R1 of a first resistor 507-1. The resistance value R1 of the first resistor 507-1 may be adjusted in response to the control signal EVIF. As the resistance value R1 of the first resistor 507-1 is adjusted, a level of each of the voltages VDD3 and VDD3' may be adjusted.

As shown in FIG. 1 or 4, the first internal voltage VDD3 may be supplied to the selection circuit 220. In FIG. 12, the first intermediate voltage VDD3' may be supplied to the selection circuit 220, rather than the first internal voltage VDD3.

FIG. 9 is a circuit diagram of the first internal voltage generator shown in FIGS. 1, 4, and 12 according to an exemplary embodiment of the present inventive concept. The first internal voltage generator 212B shown in FIG. 9 may include the charge pump 502, the amplifier 504, the switch circuit 506, and three resistors 507-1, 507-2A, and 507-2B. A voltage regulator may include the amplifier 504, the switch circuit 506, and the three resistors 507-1, 507-2A, and 507-2B. The voltage regulator may generate the first internal voltage VDD3 higher than the first external voltage VDD1.

Referring to FIGS. 8 and 9, the second resistor 507-2 of FIG. 8 is divided into two resistors 507-2A and 507-2B, and a voltage of a common node (in other words, a third node ND3) of two resistors 507-2A and 507-2B is a first intermediate voltage VDD3'. A resistance value of each of the resistors 507-2A and 507-2B may be R2/2.

The charge pump 502 may generate the first voltage pump voltage 2VDD by amplifying the first external voltage VDD 1. The amplifier 504 may amplify a difference between the reference voltage VBGR and the voltage, e.g., a feedback voltage, of the second node ND2 and generate an amplified voltage.

The switch circuit 506 may pull-up the voltage VDD3, e.g., the first internal voltage VDD3, of the first node ND1 to the first voltage pump voltage 2VDD in response to a voltage amplified by the amplifier 504.

The three resistors 507-1, 507-2A, and 507-2B may form a negative feedback network. The three resistors 507-1, 507-2A, and 507-2B may generate the first intermediate voltage VDD3' and a second intermediate voltage Vx1 by dividing the first internal voltage VDD3. A resistance value R1 of the first resistor 507-1 may be adjusted in response to the control signal EVIF. As the resistance value of the first resistor 507-1 is adjusted, a level of each of the voltages VDD3, VDD3', and Vx1 may be adjusted.

The first internal voltage VDD3 may be supplied to the selection circuit 220 as shown in FIG. 1 or 4. The first intermediate voltage VDD3' and the second intermediate voltage Vx1 may be supplied to the selection circuit 220 as shown in FIG. 12, rather than the first internal voltage VDD3.

The first internal voltage VDD3 may be defined by Equation 3.

$$VDD3 = Vx1 + 2\Delta V \qquad \text{[Equation 3]}$$

$\Delta V$ may be a difference between the first intermediate voltage VDD3' and the second intermediate voltage Vx1.

FIG. 10 is a circuit diagram of a second internal voltage generator shown in FIGS. 1, 4, and 12 according to an exemplary embodiment of the present inventive concept. A second internal voltage generator 214A shown in FIG. 10 may include a first amplifier 520, a first switch circuit 522, a second amplifier 524, a second switch circuit 526, a charge pump 528, and two resistors 507-4 and 507-5.

For example, the second internal voltage generator 214A may generate a negative second internal voltage VDD4. For example, the second internal voltage generator 214A may generate a second voltage pump voltage NVDD=−VDD1 corresponding to a negative first external voltage −VDD1 using the charge pump 528.

When the second amplifier 524, the second switch circuit 526, and the two resistors 507-4 and 507-5 configure a first voltage regulator, the first voltage regulator may generate the second internal voltage VDD4 using the second voltage pump voltage NVDD.

Moreover, when the first amplifier 520, the first switch circuit 522, and the two resistors 507-4 and 507-5 configure a second voltage regulator, the second voltage regulator may generate a third intermediate voltage Vx2 using the first external voltage VDD1.

The first amplifier 520 may use the first external voltage VDD1 and the ground voltage as operation voltages, amplify a difference between a reference voltage VBGR and a voltage (e.g., feedback voltage) of a first node ND5, and generate an amplified voltage.

The first switch circuit 522 may pull-up a voltage Vx2, in other words, the third intermediate voltage Vx2, of the first node ND5 to the first external voltage VDD1 in response to a voltage amplified by the first amplifier 520. A resistance value R2 of the second resistor 507-5 may be larger than a resistance value R1 of the first resistor 507-4. The resistance value R1 of the first resistor 507-4 may be adjusted in response to the control signal EVIF. As the resistance value R1 of the first resistor 507-4 is adjusted, a level of each of the voltages Vx2 and VDD4 may be adjusted.

The second amplifier 524 may use the first external voltage VDD1 and the second charge pump voltage NVDD as operation voltages, amplify a difference between a voltage of a second node ND6 and the ground voltage GND and generate an amplified voltage. The second switch circuit 526 may pull-down a voltage VDD4, e.g., the second internal voltage VDD4, of a third node ND7 to the second charge pump voltage NVDD in response to a voltage amplified by the second amplifier 524.

The second internal voltage VDD4 may be supplied to the selection circuit 220 as shown in FIG. 1 or 4. The third intermediate voltage Vx2 may be supplied to the selection circuit 220 as shown in FIG. 12, rather than the second internal voltage VDD4.

FIG. 11 is a circuit diagram of the second internal voltage generator shown in FIGS. 1, 4, and 12 according to an exemplary embodiment of the present inventive concept. A second internal voltage generator 214B shown in FIG. 11 may include the first amplifier 520, the first switch circuit 522, the second amplifier 524, the second switch circuit 526, the charge pump 528, and three resistors 507-4, 507-5, and 507-6.

Except that a third resistor 507-6 is disposed between nodes ND10 and ND11, the second internal voltage generator 214A of FIG. 10 is the same as the second internal voltage generator 214B of FIG. 11 in structure and operation. A difference in voltage ΔV may be a difference between a fourth intermediate voltage Vx3 and a fifth intermediate voltage Vy.

A resistance value R2 of each of the resistors 507-5 and 507-6 may be larger than the resistance value R1 of the first resistor 507-4. The resistance value R1 of the first resistor 507-4 may be adjusted in response to the control signal EVIF. As the resistance value R1 of the first resistor 507-4 is adjusted, a level of each of the voltages Vx3 and Vy may be adjusted.

The second internal voltage VDD4 may be supplied to the selection circuit 220 as shown in FIG. 1 or 4. At least one of the fourth intermediate voltage Vx3 and the fifth intermediate voltage Vy may be supplied to the selection circuit 220 as shown in FIG. 12, rather than the second internal voltage VDD4.

FIG. 12 is a block diagram of an image sensor chip according to an exemplary embodiment of the present inventive concept. Referring to FIG. 12, an image sensor chip 200C of FIG. 12 does not use an additional ADC 250 like the image sensor chip 200A of FIG. 1. Rather, the image sensor chip 200C may use a surplus or dummy ADC 240-0 embodied in a column ADC block 240C of FIG. 13. The dummy ADC 240-0 may be a comparator.

The image sensor chip 200C may include the plurality of pins 201, 203, and 205, the internal voltage generator 210, the selection circuit 220, the voltage information ADC 250B, the encoder 255, a selection signal generator 260A, and the temperature sensor 270. The image sensor chip 200C may be manufactured by the CMOS process and may be included in a mobile device. The voltage information ADC 250B may include the comparator 240-0 and the counter 257.

The pins 201 and 203 may receive the external voltages VDD1 and VDD2 supplied by the external voltage supply device (for example, 300A of FIG. 22 or 300B of FIG. 23). The third pin 205 may transmit feedback information DCNT to the external voltage supply device 300A shown in FIG. 22 or the application processor 400 shown in FIG. 23.

For example, the feedback information DCNT may be digital signals or a digital code which represents information about the external voltage VDD1 and/or VDD2 supplied by the external voltage supply device 300A or 300B, information about each of the intermediate voltages Vx1, Vx2, Vx3, Vy, and/or VDD3' generated by the internal voltage generator 210, and/or information VTEMP about a temperature (for example, an internal temperature) of the image sensor chip 200B.

The selection circuit 220 may output at least one of the plurality of voltages VDD1, VDD2, Vx1, Vx2, Vx3, Vy, VDD3', and VTEMP as the first output voltage OUT1 in response to the selection signal SEL1.

When an input stage of the voltage information ADC 250B includes capacitors 251, 252, and 253 for sampling an analog input signal OUT1 as shown in FIG. 15, 17, 19, or 21, the input stage of the voltage information ADC 250B may attenuate the analog input signal OUT1 at a certain rate even if the attenuator 230 shown in FIG. 2 is not used. As shown in FIG. 15, 17, 19, or 21, an input signal OUT1=IN1 requiring an analog-to-digital conversion may be attenuated by the attenuation constant (a) by the capacitor 251.

The voltage information ADC 250B may convert the first output voltage OUT1 into the feedback information DCNT.

The comparator 240-0 may compare the ramp signal RAMP with the first output voltage OUT1 and generate a comparison signal Vo. The counter 257 may generate the feedback information DCNT in response to (or using) the comparison signal Vo and a clock signal CLK. An operation of the voltage information ADC 250B will be described in detail referring to FIGS. 13 to 21.

The encoder 255 may convert a c-bit digital output signal DCNT into a d-bit control signal EVIF. Each of the internal voltage generators 212 and 214 may adjust a level of each of the internal voltages VDD3 and VDD4 and/or a level of the intermediate voltages Vx1, Vx2, Vx3, Vy, and VDD3' in response to the d-bit control signal EVIF.

The image sensor chip 200C may feedback information DCNT about an external voltage VDD1 and/or VDD2 supplied by the external voltage supply device (for example, 300A of FIG. 22 or 300B of FIG. 23), information DCNT about each of the intermediate voltages Vx1, Vx2, Vx3, Vy, and VDD3' generated by the internal voltage generator 210 using the first external voltage VDD1, and/or information DCNT about a temperature of the image sensor chip 200C to the external voltage supply device (for example, 300A of FIG. 22 or 300B of FIG. 23) and/or the internal voltage generator 210.

Accordingly, the external voltage supply device (for example, 300A of FIG. 22 or 300B of FIG. 23) may adjust a level of the external voltage VDD1 and/or VDD2 supplied to the image sensor chip 200C based on (or using) the feedback information DCNT, and the internal voltage generator 210 may adjust a level of each of the internal voltages VDD3 and VDD4 and/or a level of the intermediate voltages Vx1, Vx2, Vx3, Vy, and VDD3' using (or in response to) the control signal EVIF.

Figure 13:
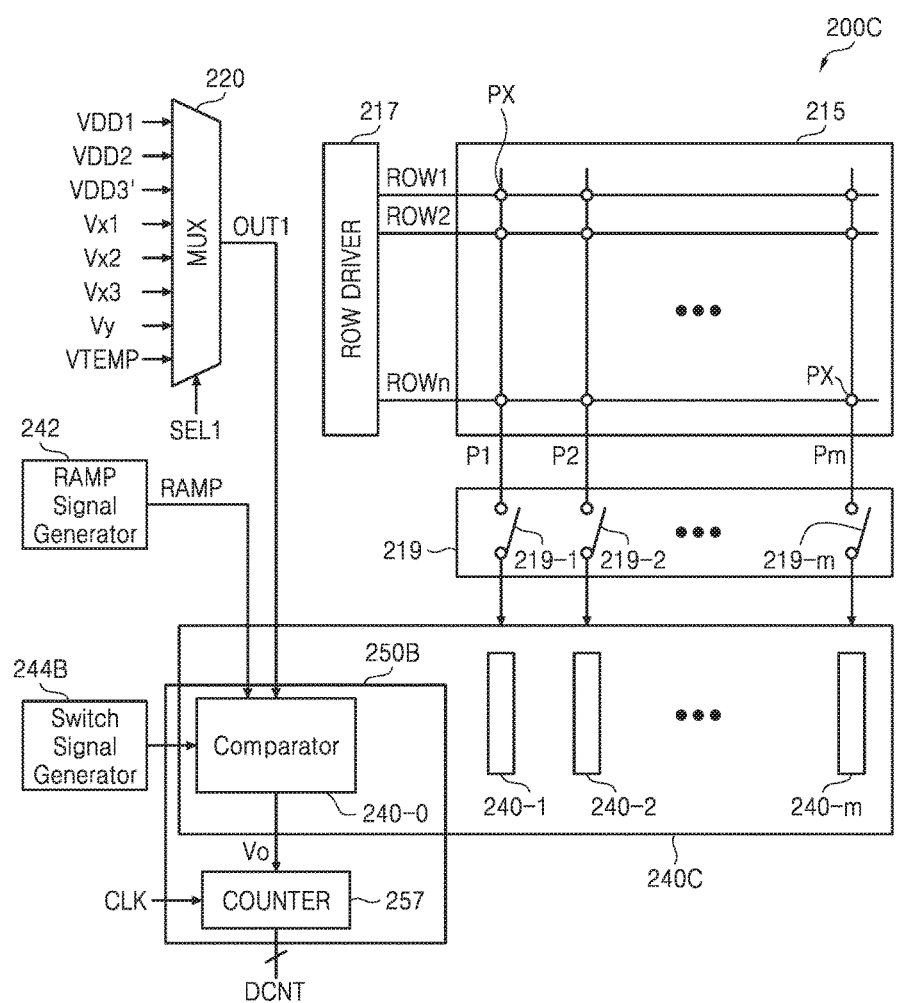
FIG. 13 is a block diagram of the image sensor chip shown in FIG. 12 according to an exemplary embodiment of the present inventive concept.

FIG. 13 is a block diagram of the image sensor chip shown in FIG. 12 according to an exemplary embodiment of the present inventive concept. Referring to FIGS. 12 and 13, the image sensor chip 200C may include the active pixel sensor array 215, the row driver 217, the CDS circuit block 219, the selection circuit 220, the column ADC block 240C, the ramp signal generator 242, a switch signal generator 244B, and the counter 257.

In the image sensor chip 200C, components not shown in FIG. 12 may be complemented or supplemented with the components 215, 217, 219, 240C, 242, and 244B shown in FIG. 13, and components not shown in FIG. 13 may be complemented or supplemented with the components 201, 203, 205, 210, 255, 260A, and 270 shown in FIG. 12.

The column ADC block 240C may include ADCs 240-1 to 240-m and the dummy ADC 240-0. The ADCs 240-1 to 240-m may convert correlated double sampled pixel signals into digital signals. Each of the ADCs 240-0 to 240-m may be embodied in a single slope ADC. According to an exemplary embodiment of the present inventive concept, each of the ADCs 240-1 to 240-m may be embodied to be the same as or different from the dummy ADC 240-0 in structure and operation.

The ramp signal generator 242 may generate a ramp signal RAMP, and the ramp signal RAMP may be supplied to each of the ADCs 240-0 to 240-m. The switch signal generator 244B may control an activation timing and a deactivation timing of each switch signal shown in FIGS. 6, 14, 16, 18, and 20.

Figure 15:
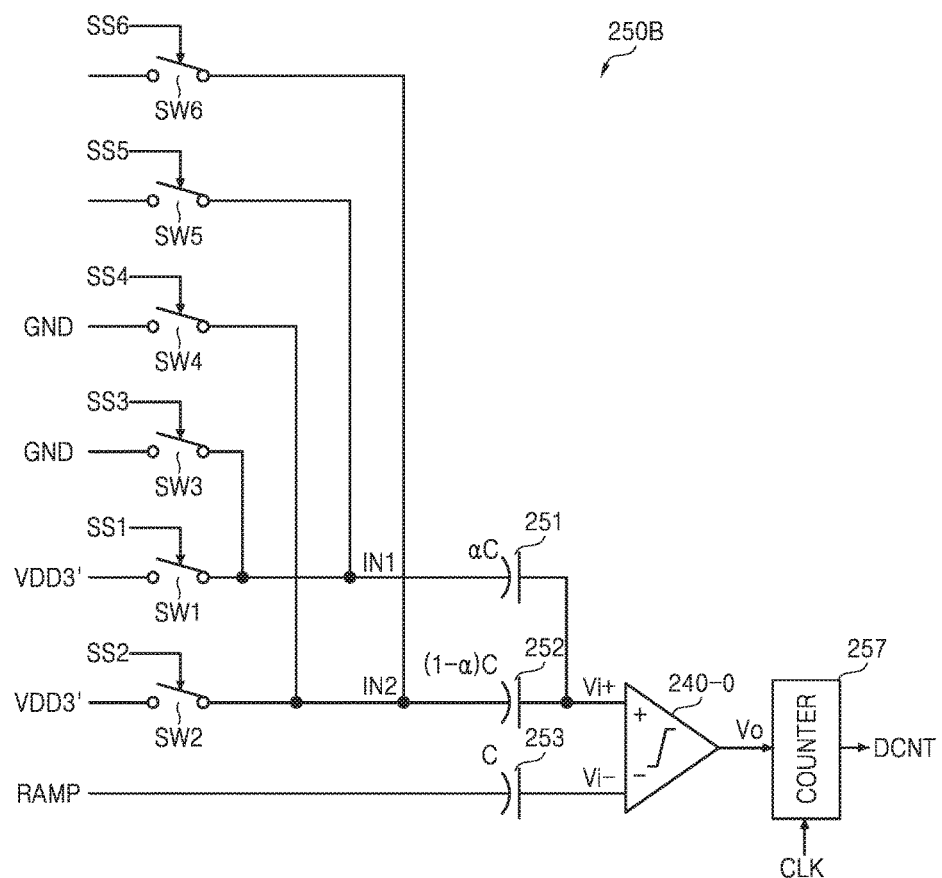
FIG. 15 shows a structure of the voltage information analog-to-digital converter shown in FIGS. 12 and 13 for measuring the first internal voltage of the first internal voltage generator shown in FIG. 8 according to an exemplary embodiment of the present inventive concept.

Referring to FIG. 15, the voltage information ADC 250B may include a plurality of switches SW1 to SW6, a plurality of capacitors 251, 252, and 253, the comparator 240-0, and the counter 257. Some of the plurality of switches SW1 to SW6 may not be used by controlling the switch signal generator 244B according to the voltages VDD1, VDD2, Vx1, Vx2, Vx3, Vy, VDD3', VDD3, VDD4, and/or VTEMP to be subject to analog-to-digital conversion.

For example, referring to FIGS. 6 and 15, when a voltage to be subject to analog-to-digital conversion is a voltage VDD1, VDD2, VDD3, VDD4, or VTEMP, some SW4 to SW6 of the plurality of switches SW1 to SW6 may not be used.

Figure 14:
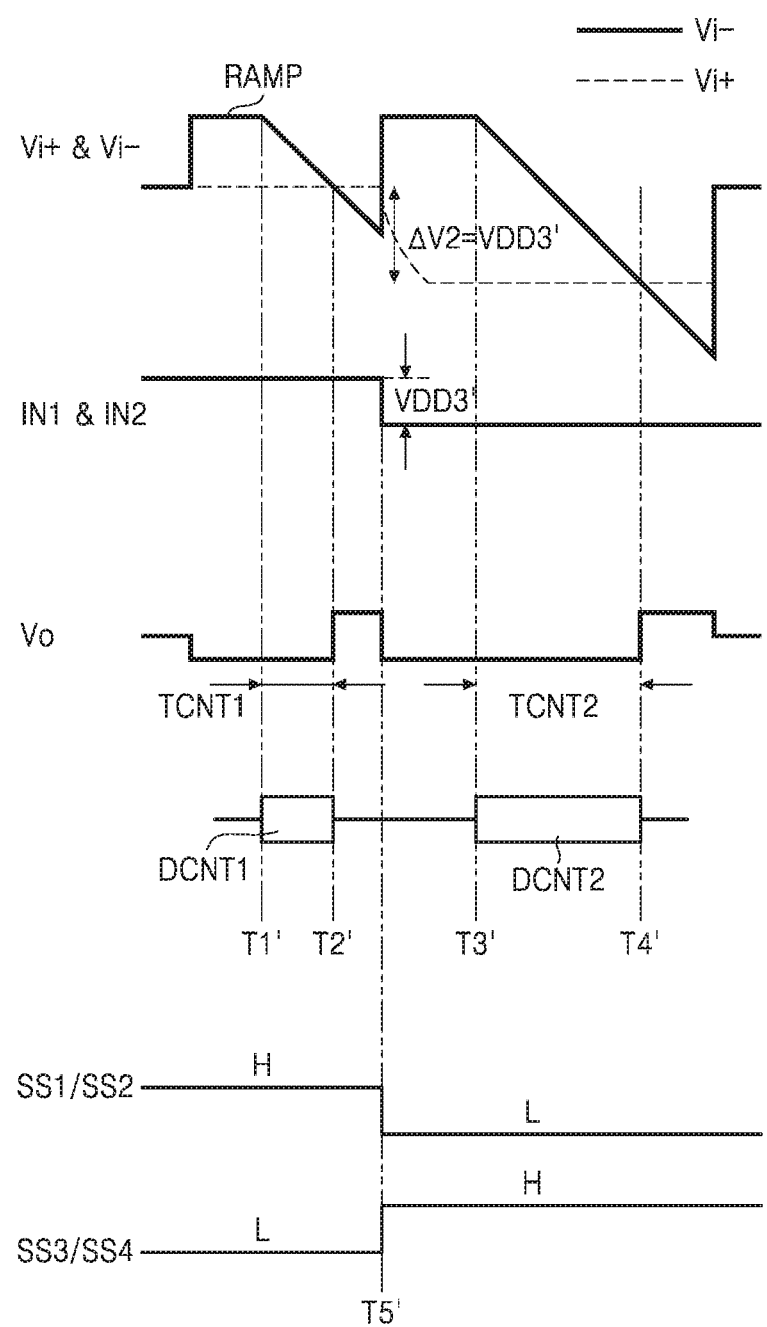
FIG. 14 is a timing diagram for describing a method of measuring a first internal voltage of the first internal voltage generator shown in FIG. 8 according to an exemplary embodiment of the present inventive concept.

FIG. 14 is a timing diagram for describing a method of measuring a first internal voltage of the first internal voltage generator shown in FIG. 9 according to an exemplary embodiment of the present inventive concept, and FIG. 15 shows a structure of the voltage information ADC shown in FIGS. 12 and 13 for measuring the first internal voltage of the first internal voltage generator shown in FIG. 8 according to an exemplary embodiment of the present inventive concept.

When a feedback signal DCNT related to each of the voltages VDD1, VDD2, and VTEMP is generated using the voltage information ADC 250B, switches SW4 to SW6 of the plurality of switches SW1 to SW6 included in the voltage information ADC 250B are not used, and an arrangement and an operation of the switches SW1 to SW3 used in the voltage information ADC 250B are the same as or similar to what is described with reference to FIGS. 6 and 7.

As shown in FIG. 15, switches SW5 and SW6 of the plurality of switches Sw1 to SW6 are not used in the generation of a feedback signal DCNT related to the first internal voltage VDD3. The selection circuit 220 outputs the first intermediate voltage VDD3' as the first output voltage OUT1 in response to the selection signal SEL1.

As shown in FIG. 14, an analog-to-digital conversion on the first intermediate voltage VDD3' is performed once. The switch signal generator 244B activates each of the switch signals SS1 and SS2 to a high level and deactivates each of the switch signals SS3 and SS4 to a low level.

The first output voltage OUT1 is supplied to the first capacitor 251 and the second capacitor 252 at the same time. A voltage IN1=OUT1 supplied to the first capacitor 251 through the first switch SW1 and a voltage IN2=OUT1 supplied to the second capacitor 252 through the second switch SW2 are the same as each other. The ramp signal RAMP is supplied to the second input terminal − of the comparator 240-0 through the third capacitor 253.

For the conversion, a time interval from a time T1' at which the ramp signal RAMP linearly falls (or ramps-down) to a time T2' at which an output signal Vo of the comparator 240-0 transits from a low level to a high level is a first time interval TCNT1. When a voltage Vi+ of the first input terminal + of the comparator 240-0 is the same as a voltage Vi− of the second input terminal − of the comparator 240-0, the comparator 240-0 generates the output signal Vo transiting from a low level to a high level.

The counter 257 counts the first time interval TCNT1 in response to the clock signal CLK and generates a first count value, e.g., a first digital code DCNT1. Each of the switch signals SS1 and SS2 is deactivated to a low level and each of the switch signals SS3 and SS4 is activated to a high level at a time T5'.

As a first terminal of each of the capacitors 251 and 252 is connected to a ground, the voltage Vi+ of the first input terminal + of the comparator 240-0 is changed. A change amount ΔV of the voltage Vi+ of the first input terminal + may be VDD3'.

A time interval from a time T3' at which the ramp signal RAMP linearly falls to a time T4' at which the output signal $V_o$ of the comparator 240-0 transits from a low level to a high level is a second time interval TCNT2. When the voltage Vi+ of the first input terminal + of the comparator 240-0 is the same as the voltage Vi− of the second input terminal − of the comparator 240-0 (T4'), the comparator 240-0 generates the output signal Vo transiting from a low level to a high level.

From the time T3', the counter 257 counts the second time interval TCNT2 in response to the clock signal CLK and generates a second count value, e.g., a second digital code DCNT2. In other words, the counter 257 starts a count operation at the time T3' at which the ramp signal RAMP linearly falls using the clock signal CLK, and stops the count operation at the time T4' at which the output signal Vo of the comparator 240-0 transits from a low level to a high level. The counter 257 may store the second digital code DCNT2 at a time when the count operation is stopped.

The counter 257 may calculate a difference between the second digital code DCNT2 and the first digital code DCNT1, and generate and store a digital code DCNT=DCNT2−DCNT1 which can be used as feedback information according to a result of the calculation.

According to an exemplary embodiment of the present inventive concept, the counter 257 may calculate a difference between the second digital code DCNT2 and the first digital code DCNT1 using the bit reversal technique, and generate and store the digital code DCNT. For example, the counter 257 may reverse each of all bits included in the first digital code DCNT1, and generate the digital code DCNT by adding the reversed first digital code and the second digital code DCNT2. The counter 257 may include a count function, a difference calculation function, and a storage function.

The digital code DCNT=DCNT2−DCNT1 may be transmitted to the power management IC 300A of FIG. 22 or the application processor 400 of FIG. 23 through the third pin 205. The power management IC 300A of FIG. 22 or the application processor 400 of FIG. 23 may measure or calculate the first internal voltage VDD3 using Equation 4.

$$DCNT_{max}:VREF = (1+R_2/R_1) \times DCNT:VDD3 \qquad \text{[Equation 4]}$$

Here, $DCNT_{max}$ is a number determined according to a resolution of the voltage information ADC 250B, and, for example, when the voltage information ADC 250B is a 10-bit ADC, $DCNT_{max}$ may be $2^{10}=1024$. R1 is a resistance value of the first resistor 507-1, R2 is a resistance value of the second resistor 507-2, and DCNT is a digital version of the first intermediate voltage VDD3'.

The power management IC 300A of FIG. 22 or the application processor 400 of FIG. 23 know values of $DCNT_{max}$, VREF, R1, and R2, and thus, may calculate or measure the first internal voltage VDD3 using the digital code DCNT.

The power management IC 300A of FIG. 22 or the application processor 400 of FIG. 23 may increase or decrease a supply voltage V1 using the calculated or measured first internal voltage VDD3.

Figure 16:
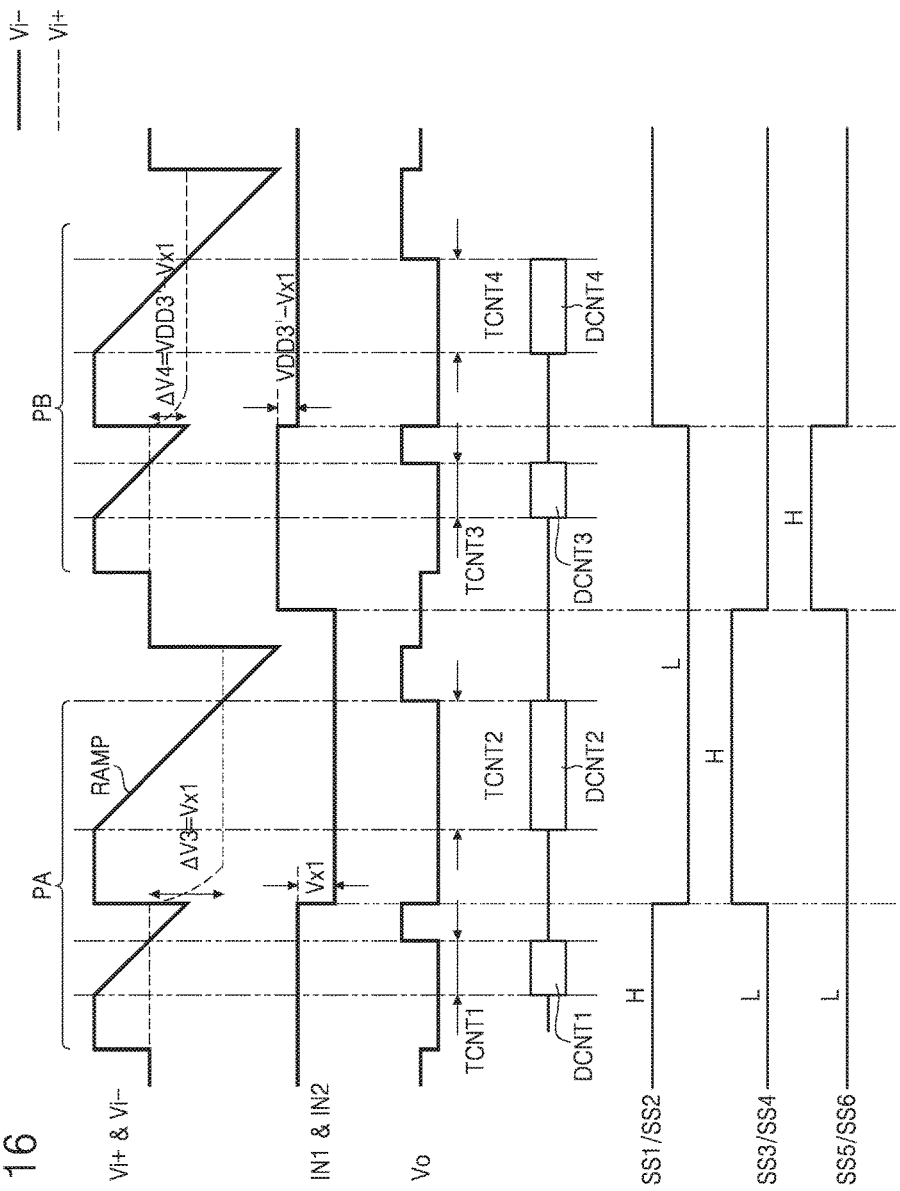
FIG. 16 is a timing diagram for describing a method of measuring the first internal voltage of the first internal voltage generator shown in FIG. 9 according to an exemplary embodiment of the present inventive concept.
Figure 17:
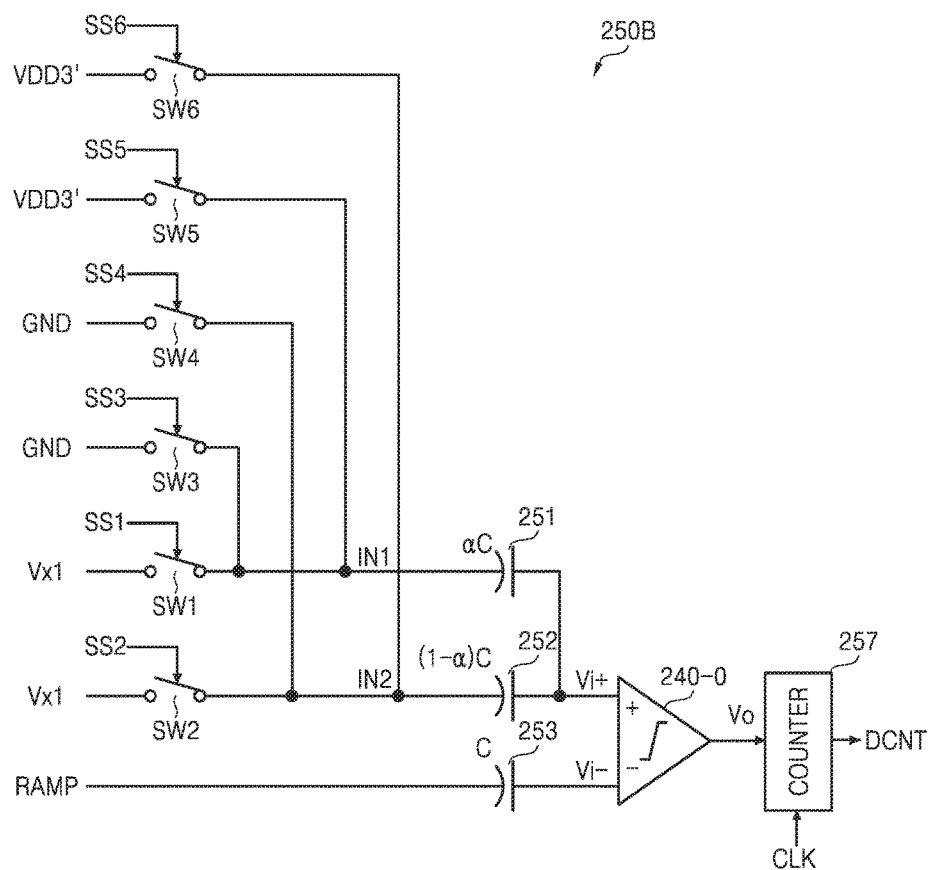
FIG. 17 shows a structure of the voltage information analog-to-digital converter shown in FIGS. 12 and 13 for measuring the first internal voltage of the first internal voltage generator shown in FIG. 9 according to an exemplary embodiment of the present inventive concept.

FIG. 16 is a timing diagram for describing a method of measuring the first internal voltage of the first internal voltage generator shown in FIG. 9 according to an exemplary embodiment of the present inventive concept, and FIG. 17 shows a structure of the voltage information analog-to-digital converter shown in FIGS. 12 and 13 for measuring the first internal voltage of the first internal voltage generator shown in FIG. 9 according to an exemplary embodiment of the present inventive concept.

When the feedback signal DCNT related to each of the voltages VDD1, VDD2, and VTEMP is generated using the voltage information ADC 250B, switches SW4 to SW6 of the plurality of switches SW1 to SW6 included in the voltage information ADC 250B are not used, and the arrangement and the operation of the switches SW1 to SW3 used in the voltage information ADC 250B are the same as or similar to what is described with reference to FIGS. 6 and 7.

As shown in FIG. 17, all of the plurality of switches SW1 to SW6 are used in the generation of the feedback signal DCNT related to the first internal voltage VDD3.

The selection circuit 220 outputs the first intermediate voltage VDD3' and the second intermediate voltage Vx1 as first output voltages OUT1 in response to the selection signal SEL1.

A digital version DCNTA of the second intermediate voltage Vx1 is calculated in a first interval PA, and a digital version DCNTB of a difference ΔV4=VDD3'−Vx1 between the first intermediate voltage VDD3' and the second intermediate voltage Vx1 is calculated in a second interval PB.

Each count value, e.g., each of the digital codes DCNT1, DCNT2, DCNT3, and DCNT4, is generated by the counter 257 in each of the time intervals TCNT1, TCNT2, TCNT3, and TCNT4.

When the second intermediate voltage Vx1 is supplied to the capacitors 251 and 252 through switches SW1 and SW2 in the first interval PA, the first intermediate voltage VDD3' is not supplied to the switches SW5 and SW6. When the second intermediate voltage Vx1 is supplied to the capacitors 251 and 252 through the switches SW1 and SW2 in the first interval PA, the counter 257 generates the first digital code DCNT1 in the first time interval TCNT1.

When the ground voltage GND is supplied to a first terminal of each of the capacitors 251 and 252 through the switches SW3 and SW4 in the first interval PA, the counter 257 generates the second digital code DCNT2 in the second time interval TCNT2. The counter 257 may calculate a difference DCNTA=DCNT2−DCNT1 between the second digital code DCNT2 and the first digital code DCNT1.

When the first intermediate voltage VDD3' is supplied to the capacitors 251 and 252 through the switches SW5 and SW6 in the second interval PB, the second intermediate voltage Vx1 is not supplied to the switches SW1 and SW2. When the first intermediate voltage VDD3' is supplied to the capacitors 251 and 252 through the switches SW5 and SW6 in the second interval PB, the counter 257 generates a third digital code DCNT3 in a third time interval TCNT3.

When the switches SW5 and SW6 are opened and the second intermediate voltage Vx1 is supplied to a first terminal of each of the capacitors 251 and 252 through the switches SW1 and SW2 in the second interval PB, the counter 257 generates a fourth digital code DCNT4 in a fourth time interval TCNT4.

The counter 257 may calculate a difference DCNTB=DCNT4−DCNT3 between the fourth digital code DCNT4 and the third digital code DCNT3, and the counter 257 may output the digital code DCNT according to Equation 5.

$$DCNT=DCNTA+2*DCNTB$$

$$DCNTA=DCNT2-DCNT1, DCNTB=DCNT4-DCNT3 \quad [\text{Equation 5}]$$

DCNTA is a digital version of the second intermediate voltage Vx1, DCNTB is a digital version of the difference ΔV4 between the first intermediate voltage VDD3' and the second intermediate voltage Vx1 shown in FIGS. 10, and ΔV3 corresponds to a voltage conversion of the voltage Vi+ of the first input terminal + of the comparator 240-0.

The digital code DCNT may be transmitted to the power management IC 300A of FIG. 22 or the application processor 400 of FIG. 23 through the internal voltage generator 210 and/or the third pin 205.

The power management IC 300A of FIG. 22 or the application processor 400 of FIG. 23 know values of $DCNT_{max}$ and VREF, and thus, may calculate or measure the first internal voltage VDD3 using the digital code DCNT. In other words, the power management IC 300A or the application processor 400 may calculate or measure the first internal voltage VDD3 using Equation 6.

$$DCNT_{max}:VREF=DCNT:VDD3 \quad [\text{Equation 6}]$$

The power management IC 300A of FIG. 22 or the application processor 400 of FIG. 23 may increase or decrease the supply voltage V1 using the calculated or measured first internal voltage VDD3.

Figure 18:
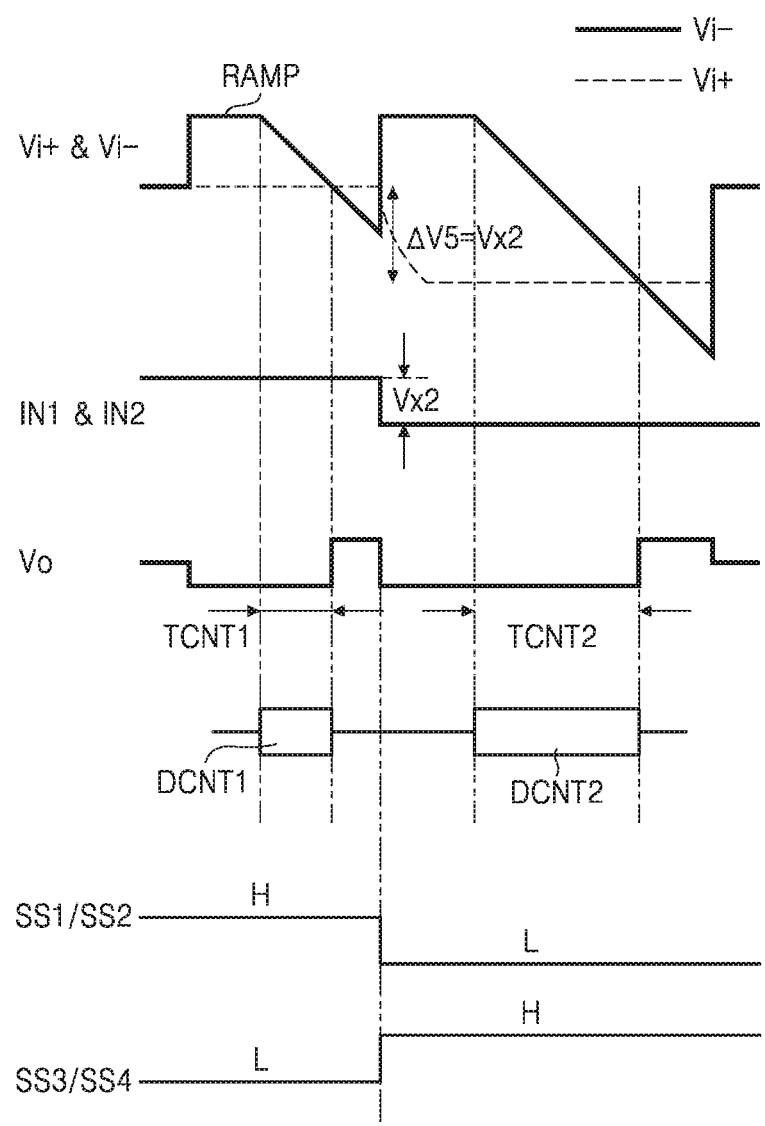
FIG. 18 is a timing diagram for describing a method of measuring a second internal voltage of the second internal voltage generator shown in FIG. 10 according to an exemplary embodiment of the present inventive concept.
Figure 19:
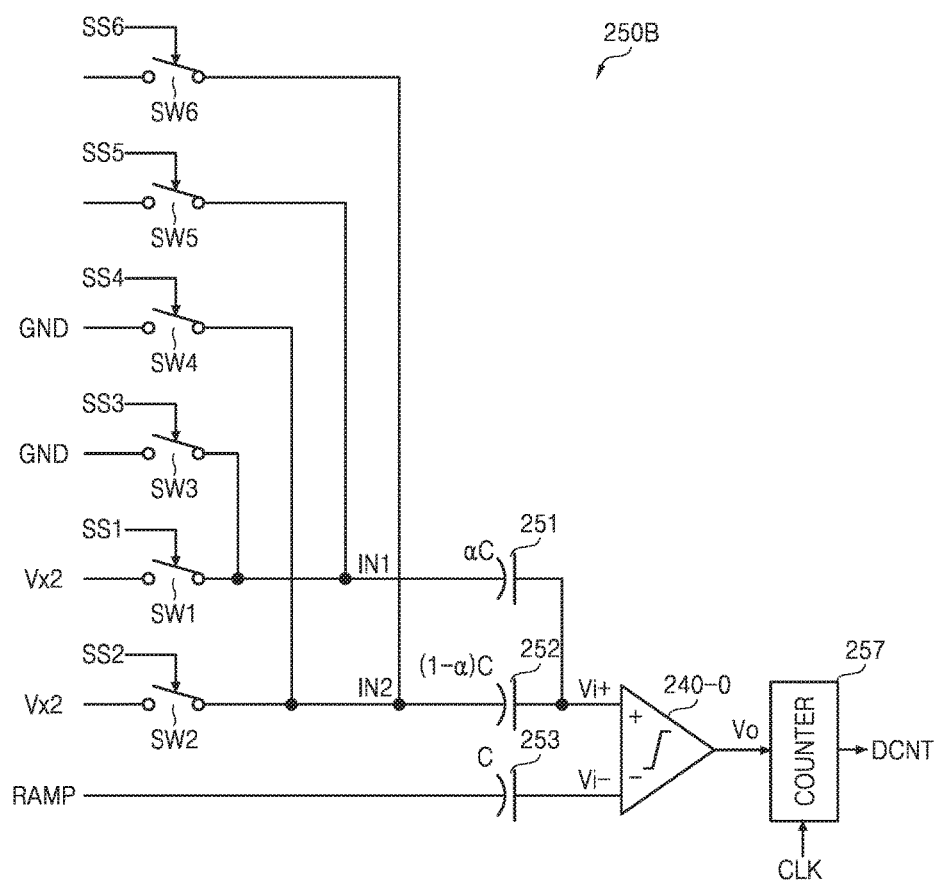
FIG. 19 shows a structure of the voltage information analog-to-digital converter shown in FIGS. 12 and 13 for measuring the second internal voltage of the second internal voltage generator shown in FIG. 10 according to an exemplary embodiment of the present inventive concept.

FIG. 18 is a timing diagram for describing a method of measuring a second internal voltage of the second internal voltage generator shown in FIG. 10 according to an exemplary embodiment of the present inventive concept, and FIG. 19 shows a structure of the voltage information analog-to-digital converter shown in FIGS. 12 and 13 for measuring the second internal voltage of the second internal voltage generator shown in FIG. 10 according to an exemplary embodiment of the present inventive concept.

When the feedback signal DCNT related to each of the voltages VDD1, VDD2, and VTEMP is generated using the voltage information ADC 250B, switches SW4 to SW6 of the plurality of switches SW1 to SW6 included in the voltage information ADC 250B are not used, and the arrangement and the operation of the switches SW1 to SW3 are the same as or similar to what is described with reference to FIGS. 6 and 7.

As shown in FIG. 19, switches SW5 and SW6 of the plurality of switches SW1 to SW6 are not used in the generation of a feedback signal DCNT related to the second internal voltage VDD4.

The selection circuit 220 outputs a third intermediate voltage Vx2 as the first output voltage OUT1 in response to the selection signal SEL1.

As shown in FIG. 18, an analog-to-digital conversion on the third intermediate voltage Vx2 is performed once. The switch signal generator 244B activates each of the switch signals SS1 and SS2 to a high level and deactivates each of the switch signals SS3 and SS4 to a low level.

The first output voltage OUT1=Vx2 is supplied to the first capacitor 251 and the second capacitor 252 at the same time. A voltage IN1=Vx2 supplied to the first capacitor 251 through the first switch SW1 is the same as a voltage IN2=Vx2 supplied to the second capacitor 252 through the second switch SW2. The ramp signal RAMP is supplied to the second input terminal − of the comparator 240-0 through the third capacitor 253.

The counter 257 counts the first time interval TCNT1 in response to the clock signal CLK and generates a first count value, e.g., the first digital code DCNT1.

As a first terminal of each of the capacitors 251 and 252 is connected to the ground, the voltage Vi+ of the first input terminal + of the comparator 240-0 is changed. A change amount ΔV5 of the voltage Vi+ of the first input terminal + may be Vx2.

The counter 257 counts the second time interval TCNT2 in response to the clock signal CLK and generates a second count value, e.g., the second digital code DCNT2.

The counter 257 may calculate a difference between the second digital code DCNT2 and the first digital code DCNT1, and generate and store the digital code DCNT=DCNT2−DCNT1 which can be used as feedback information according to a result of the calculation.

The digital code DCNT=DCNT2−DCNT1 may be transmitted to the power management IC 300A of FIG. 22 or the application processor 400 of FIG. 23 through the third pin 205. The power management IC 300A of FIG. 22 or the application processor 400 of FIG. 23 may measure or calculate the second internal voltage VDD4 using Equation 7.

$$DCNT_{max}:VREF=(R_2/R_1)\times DCNT:VDD4 \qquad [\text{Equation 7}]$$

Here, $DCNT_{max}$ is a number determined according to the resolution of the voltage information ADC 250B, and, for example, when the voltage information ADC 250B is a 10-bit ADC, $DCNT_{max}$ may be $2^{10}$=1024. R1 is a resistance value of the first resistor 507-4, R2 is a resistance value of the second resistor 507-5, and DCNT is a digital version of the third intermediate voltage Vx2.

The power management IC 300A of FIG. 22 or the application processor 400 of FIG. 23 know values of DCNT-max, VREF, R1, and R2, and thus, may calculate or measure the second internal voltage VDD4 using the digital code DCNT.

The power management IC 300A of FIG. 22 or the application processor 400 of FIG. 23 may increase or decrease the supply voltage V1 using the calculated or measured second internal voltage VDD4. Moreover, the second internal voltage generator 214A may adjust a level of the third intermediate voltage Vx2 using the control signal EVIF corresponding to the digital code DCNT.

Figure 20:
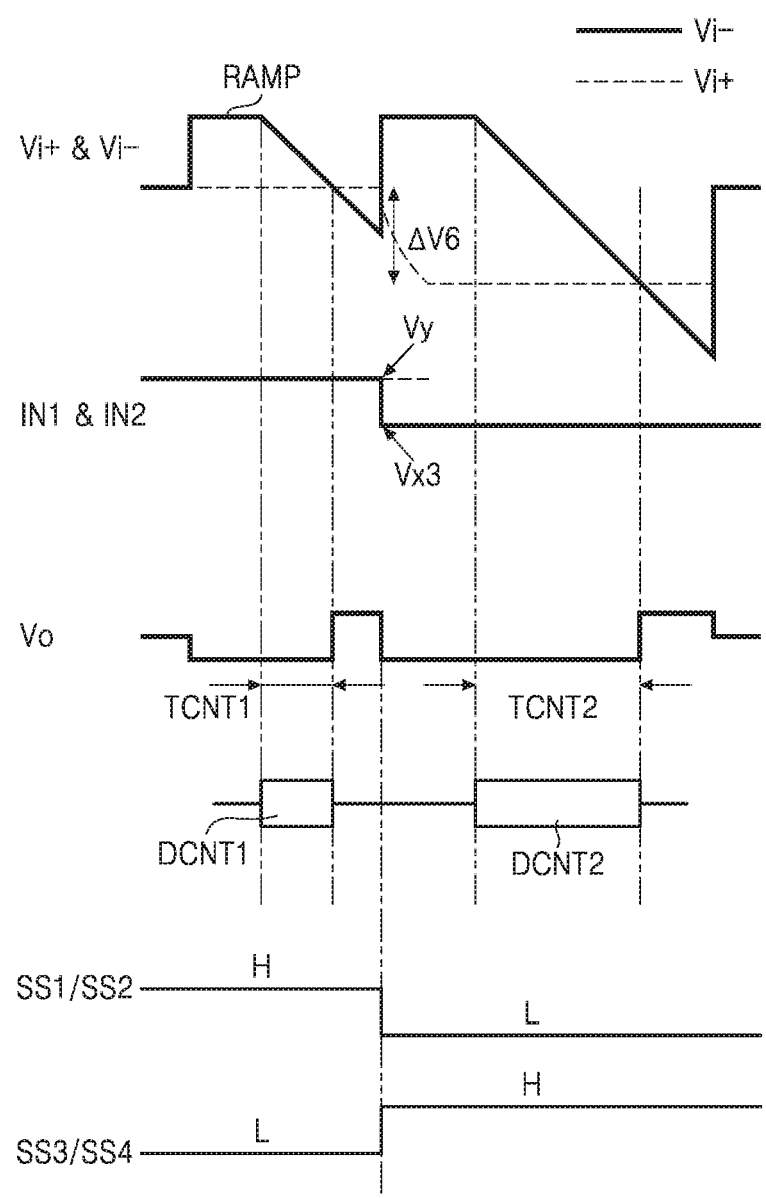
FIG. 20 is a timing diagram for describing a method of measuring the second internal voltage of the second internal voltage generator shown in FIG. 11 according to an exemplary embodiment of the present inventive concept.
Figure 21:
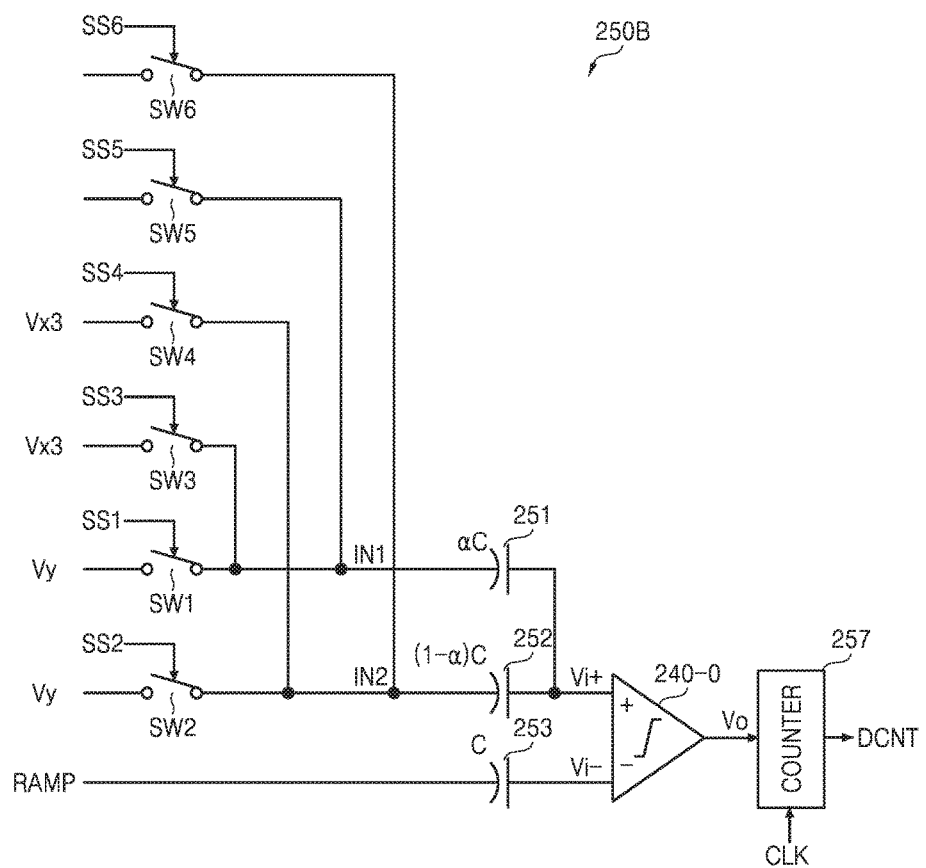
FIG. 21 shows a structure of the voltage information analog-to-digital converter shown in FIGS. 12 and 13 for measuring the second internal voltage of the second internal voltage generator shown in FIG. 11 according to an exemplary embodiment of the present inventive concept.

FIG. 20 is a timing diagram for describing a method of measuring the second internal voltage of the second internal voltage generator shown in FIG. 11 according to an exemplary embodiment of the present inventive concept, and FIG. 21 shows a structure of the voltage information analog-to-digital converter shown in FIGS. 12 and 13 for measuring the second internal voltage of the second internal voltage generator shown in FIG. 11 according to an exemplary embodiment of the present inventive concept.

When the feedback signal DCNT related to each of the voltages VDD1, VDD2, and VTEMP is generated using the voltage information ADC 250B, switches SW4 to SW6 of the plurality of switches SW1 to SW6 included in the voltage information ADC 250B are not used, and the arrangement and the operation of the switches SW1 to SW3 used in the voltage information ADC 250B are the same as or similar to what is described with reference to FIGS. 6 and 7.

As shown in FIG. 21, switches SW5 and SW6 of the plurality of switches SW1 to SW6 are not used in the generation of the feedback signal DCNT related to the second internal voltage VDD4.

The selection circuit 220 outputs the fifth intermediate voltage Vy as the first output voltage OUT1 in response to the selection signal SEL1.

As shown in FIG. 20, an analog-to-digital conversion on a difference between the fourth intermediate voltage Vx3 and the fifth intermediate voltage Vy is performed once. The switch signal generator 244B activates each of the switch signals SS1 and SS2 to a high level and deactivates each of the switch signals SS3 and SS4 to a low level.

The first output voltage OUT1=Vy is supplied to the first capacitor 251 and the second capacitor 252 at the same time. A voltage IN1=Vy supplied to the first capacitor 251 through the first switch SW1 is the same as a voltage IN2=Vy supplied to the second capacitor 252 through the second switch SW2. The ramp signal RAMP is supplied to the second input terminal − of the comparator 240-0 through the third capacitor 253.

The counter 257 counts the first time interval TCNT1 in response to the clock signal CLK and generates a first count value, e.g., the first digital code DCNT1.

The switch signal generator 244B deactivates each of the switch signals SS1 and SS2 to a low level and activates each of the switch signals SS3 and SS4 to a high level. At this time, the selection circuit 220 outputs the fourth intermediate voltage Vx3 as the first output voltage OUT1 in response to the selection signal SEL1.

As the fourth intermediate voltage Vx3 is supplied to a first terminal of each of the capacitors 251 and 252 through each of the switches SW3 and SW4, the voltage Vi+ of the first input terminal + of the comparator 240-0 is changed. A change amount ΔV6 of the voltage Vi+ of the first input terminal + may be a difference (=Vy−Vx3) between the fifth intermediate voltage Vy and the fourth intermediate voltage Vx3.

The counter 257 counts the second time interval TCNT2 in response to the clock signal CLK and generates a second count value, e.g., the second digital code DCNT2.

The counter 257 may calculate a difference between the second digital code DCNT2 and the first digital code DCNT1, and generate and store the digital code DCNT=DCNT2−DCNT1 which can be used as feedback information according to a result of the calculation.

The digital code DCNT=DCNT2−DCNT1 may be transmitted to the power management IC 300A of FIG. 22 or the application processor 400 of FIG. 23 through the third pin 205. The power management IC 300A of FIG. 22 or the application processor 400 of FIG. 23 may measure or calculate the second internal voltage VDD4 using Equation 8.

$$DCNT_{max}:VREF=DCNT:VDD4 \qquad [\text{Equation 8}]$$

The power management IC 300A of FIG. 22 or the application processor 400 of FIG. 23 know values of DC- NT$_{max}$ and VREF, and thus, may calculate or measure the second internal voltage VDD4 using the digital code DCNT.

The power management IC 300A of FIG. 22 or the application processor 400 of FIG. 23 may increase or decrease the supply voltage V1 using the calculated or measured second internal voltage VDD4. Moreover, the second internal voltage generator 214A may adjust a level of each of the fourth intermediate voltage Vx3 and the fifth intermediate voltage Vy using the control signal EVIF corresponding to the digital code DCNT.

FIG. 22 is a block diagram of an image processing system 100A including the image sensor chip 200 shown in FIG. 1, 4, or 12 according to an exemplary embodiment of the present inventive concept. Referring to FIGS. 1 to 22, the power management IC 300A may calculate or measure each of the voltages VDD1, VDD2, VDD3, VDD4, and VTEMP using (or in response to) the feedback information (VIF or DCNT) transmitted through the third pin 205, and adjust (for example, increase, maintain, or decrease) a first voltage V1 and a second voltage V2 supplied to the image sensor chip 200 through transmission lines 301 and 303 according to a result of the calculation.

FIG. 23 is a block diagram of an image processing system 100B including the image sensor chip 200 shown in FIG. 1, 4, or 12 according to an exemplary embodiment of the present inventive concept. Referring to FIGS. 1 to 21, and 23, the application processors 400 may calculate or measure each of the voltages VDD1, VDD2, VDD3, VDD4, and VTEMP using the feedback information VIF or DCNT transmitted through the third pin 205, and transmit a voltage control signal CTRL to the power management IC 300B according to a result of the calculation. The power management IC 300B may adjust (for example, increase, maintain, or decrease) the first voltage V1 and the second voltage V2 in response to the voltage control signal CTRL. The first voltage V1 and the second voltage V2 may be transmitted to the image sensor chip 200 through the transmission lines 301 and 303.

An image sensor chip including an internal voltage generator according to an exemplary embodiment of the present inventive concept can feedback information about an external voltage supplied by an external voltage supply device, information about an internal voltage generated by the internal voltage generator using the external voltage, and information about a temperature of the image sensor chip to the external voltage supply device and/or the internal voltage generator. Therefore, the external voltage supply device can adjust the external voltage supplied to the image sensor chip using the feedback result and the internal voltage generator can adjust the internal voltage using the feedback result.

The image sensor chip according to an exemplary embodiment of the present inventive concept can monitor one of a temperature voltage and all voltages used in the image sensor chip, and feedback a result of the monitoring to a power management IC or an application processor for controlling the image sensor chip as feedback information. Accordingly, the power management IC or the application processor can maximize performance of the image sensor chip using the feedback information in real time.

While the present inventive concept has been shown and described with reference to exemplary embodiments thereof, it will be appreciated by those skilled in the art that changes may be made in these embodiments without departing from the scope and spirit of the present inventive concept as defined in the appended claims.

What is claimed is:

1. An image sensor chip, comprising:
    an internal voltage generator for generating internal voltages using an external voltage received at a first terminal of the image sensor chip;
    a temperature sensor for generating a temperature voltage;
    a selection circuit for outputting one of the external voltage, the internal voltages, and the temperature voltage;
    a digital code generation circuit for generating a digital code using an output voltage of the selection circuit; and
    a second terminal for outputting the digital code from the image sensor chip.

2. The image sensor chip of claim 1, wherein the digital code corresponds to the external voltage, the internal voltages, or the temperature voltage.

3. The image sensor chip of claim 1, wherein the digital code generation circuit includes;
    an attenuator for generating a second output signal by attenuating a first output signal of the selection circuit; and
    a first analog-to-digital converter for converting the second output signal into the digital code.

4. The image sensor chip of claim 1, further comprising an encoder for encoding the digital code and generating a control signal according to a result of the encoding,
    wherein the internal voltage generator adjusts one of the internal voltages in response to the control signal.

5. The image sensor chip of claim 1, wherein the digital code generation circuit includes a first analog-to-digital converter for generating the digital code using an output signal output from the selection circuit,
    the image sensor chip includes:
    a pixel; and
    a second analog-to-digital converter for converting a pixel signal output from the pixel into a digital signal, and
    a structure of the first analog-to-digital converter is the same as a structure of the second analog-to-digital converter.

6. The image sensor chip of claim 1, wherein the digital code generation circuit includes:
    a comparator including a first input terminal and a second input terminal;
    a first switch and a second switch connected to an output terminal of the selection circuit;
    a first capacitor connected between the first switch and the first input terminal;
    a second capacitor connected between the second switch and the first input terminal;
    a third switch connected between a common node of the first switch and the first capacitor and a ground;
    a third capacitor connected between a terminal for receiving a ramp signal and the second input terminal; and
    a counter connected to an output terminal of the comparator.

7. The image sensor chip of claim 1, wherein the internal voltage generator generates a first internal voltage higher than the external voltage and a second internal voltage lower than a ground voltage as the internal voltages.

8. The image sensor chip of claim 1, wherein the internal voltage generator generates a first internal voltage higher than the external voltage and a first intermediate voltage related to the first internal voltage as the internal voltages,
    the selection circuit outputs the first intermediate voltage, and
    the digital code generation circuit generates the digital code using the first intermediate voltage.

9. The image sensor chip of claim 1, wherein the internal voltage generator generates a first internal voltage higher than the external voltage, a first intermediate voltage related to the first internal voltage, and a second intermediate voltage related to the first intermediate voltage as the internal voltages,
the selection circuit sequentially outputs the second intermediate voltage and the first intermediate voltage, and
the digital code generation circuit generates the digital code using the second intermediate voltage and the first intermediate voltage.

10. The image sensor chip of claim 1, wherein the internal voltage generator generates a. first internal voltage lower than a ground voltage and a first intermediate voltage related to the first internal voltage as the internal voltages,
the selection circuit outputs the first intermediate voltage, and
the digital code generation circuit generates the digital code using the first intermediate voltage.

11. An image processing system, comprising:
an external voltage supply device;
an image sensor chip for receiving an external voltage supplied by the external voltage supply device; and
an application processor connected to the image sensor chip and the external voltage supply device,
wherein the image sensor chip includes:
an internal voltage generator for generating internal voltages using the external voltage;
a temperature sensor for generating a temperature voltage;
a selection circuit for outputting one of the external voltage, the internal voltages, and the temperature voltage;
a digital code generation circuit for generating a digital code using an output voltage of the selection circuit; and
an output terminal for transmitting the digital code to the application processor.

12. The image processing system of claim 11, wherein the application processor generates a voltage control signal using the digital code, and
the external voltage supply device adjusts the external voltage in response to the voltage control signal.

13. The image processing system of claim 12, wherein the digital code generation circuit includes:
an attenuator for generating a second output signal by attenuating a first output signal of the selection circuit, and
an analog-to-digital converter for converting the second output signal into the digital code.

14. The image processing system of claim 12, wherein the digital code generation circuit includes a first analog-to-digital converter for generating the digital code using an output signal output from the selection circuit,
the image sensor chip further includes:
a pixel, and
a second analog-to-digital converter for converting a pixel signal output from the pixel into a digital signal, and
a structure of the first analog-to-digital converter is the same as a structure of the second analog-to-digital converter.

15. The image processing system of claim 12, wherein the selection circuit outputs a first internal voltage among the internal voltages, and
the digital code generation circuit generates the digital code corresponding to a second internal voltage among the internal voltages using the first internal voltage.

16. The image processing system of claim 15, wherein the first internal voltage is lower than the second internal voltage, and the second internal voltage is higher than the external voltage.

17. The image processing system of claim 15, wherein the first internal voltage is higher than the second internal voltage, and the second internal voltage is lower than a ground voltage.

18. An image sensor chip, comprising:
a selection circuit configured to output one of a temperature voltage, an internal voltage, and an external voltage;
an attenuator configured to attenuate a first output signal of the selection circuit to generate a. second output signal; and
an analog-to-digital converter configured to generate a feedback signal using the second output signal.

19. The image sensor chip of claim 18, further comprising:
an internal voltage generator configured to generate the internal voltage in response to the feedback signal.

20. The image sensor chip of claim 18, further comprising:
a temperature sensor configured to generate the temperature voltage corresponding to an operating temperature of the image sensor chip.

* * * * *